(12) United States Patent
Lubomirsky et al.

(10) Patent No.: US 12,372,874 B2
(45) Date of Patent: Jul. 29, 2025

(54) SYSTEM ARCHITECTURE OF MANUFACTURING OF SEMICONDUCTOR WAFERS

(71) Applicant: Applied Materials, Inc., Santa Clara, CA (US)

(72) Inventors: Dmitry Lubomirsky, Cupertino, CA (US); Huixiong Dai, San Jose, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 621 days.

(21) Appl. No.: 17/717,856

(22) Filed: Apr. 11, 2022

(65) Prior Publication Data

US 2022/0326618 A1    Oct. 13, 2022

Related U.S. Application Data

(60) Provisional application No. 63/173,743, filed on Apr. 12, 2021.

(51) Int. Cl.
*G03F 7/40*    (2006.01)
*G03F 7/38*    (2006.01)

(52) U.S. Cl.
CPC . *G03F 7/40* (2013.01); *G03F 7/38* (2013.01)

(58) Field of Classification Search
CPC .................................... G03F 7/40; G03F 7/38
See application file for complete search history.

(56) References Cited

U.S. PATENT DOCUMENTS 10,289,005 B2 *   5/2019   Lee ........................... G03F 7/40
11,815,816 B2 *   11/2023  Buchberger, Jr. ..........................
                                                        H01L 21/68728

* cited by examiner

*Primary Examiner* — Hung V Nguyen
(74) *Attorney, Agent, or Firm* — Patterson + Sheridan, LLP

(57) ABSTRACT

A post lithography resist treatment apparatus for treating a substrate having a resist layer thereon with a fluid layer thereover includes at least one post exposure bake chamber having a substrate support having a substrate support surface thereon, and an electrode, the electrode comprising an electrode body having a substrate support facing side, the substrate support facing side having at least one recess extending inwardly thereof, and at least one projection adjacent to the recess having a substrate support facing surface thereon, wherein the substrate support is moveable to position a substrate, when supported thereon, such that an fluid layer disposed on the substrate contacts the substrate support facing surface of the projection but does not fill the recess with fluid, and the substrate facing surface of the electrode body is spaced from the substrate.

13 Claims, 15 Drawing Sheets

SYSTEM ARCHITECTURE OF MANUFACTURING OF SEMICONDUCTOR WAFERS

CROSS-REFERENCE TO RELATED APPLICATIONS

This application claims benefit of U.S. provisional patent application Ser. No. 63/173,743, filed Apr. 12, 2021, which is herein incorporated by reference.

BACKGROUND

Field

The present disclosure generally relates to methods and apparatus for processing a substrate, and more specifically to methods and apparatus for improving photolithography processes, more specifically methods and apparatus for a field guided post exposure bake of a resist layer, for example a chemically activated resist layer.

Description of the Related Art

Integrated circuits have evolved into complex devices that can include millions of components (e.g., transistors, capacitors and resistors) on a single chip. Photolithography is a process that is used in the fabrication of components on a chip. Generally the process of photolithography involves a few basic stages. Initially, a photoresist layer is formed on a substrate or over a film layer previously provided on the substrate, typically by spin coating wherein droplets of the photoresist in liquid form are dropped onto the surface of a spinning substrate to form a relatively uniform thickness thin layer of photoresist on the surface of the substrate or film layer thereon. One type of a photoresist, a chemically amplified photoresist, commonly includes a resist resin and a photo acid generator. The photo acid generator, upon exposure to electromagnetic radiation in the subsequent exposure of the photoresist, selectively alters the solubility of the photoresist which is useful in the development of the resist process. The electromagnetic radiation may have any suitable wavelength, for example, a 193 nm ArF laser, an electron beam, an ion beam, or other suitable source. Excess solvent may then be removed in a pre-exposure bake process.

In a resist exposure stage of the photolithography process, a photomask or reticle is used to selectively expose certain regions of the substrate to the electromagnetic radiation. Other exposure methods may be mask less exposure methods where a pattern is written into the photoresist, for example by scanning a laser beam thereon. Exposure to appropriate electromagnetic radiation decomposes the photo acid generator, which as a result generates acid and results in a latent acid image in the resist resin. After exposure, the substrate is typically heated in a post-exposure bake process. During the post-exposure bake process, the acid generated by the photo acid generator reacts with the resist resin, changing the solubility of the resist which is useful during the subsequent development process of the resist.

After the post-exposure bake, the substrate, and, particularly, the photoresist layer, is developed to remove the soluble portion thereof and leave a patterned resist layer, or "mask" on the substrate, after which the substrate is rinsed to remove the developer and any remaining byproducts of the developing reaction. Depending on the type of photoresist used, regions of the substrate that were exposed to the electromagnetic radiation may either be resistant to removal or more prone to removal. The mask pattern is transferred to an underlying portion of the substrate or film layer using a wet or dry etch process such as reactive ion etching.

One desire in the evolution of chip designs is to provide chips having faster switching circuitry and a greater circuit density. The demands for greater circuit density necessitate a reduction in the dimensions of the integrated circuit components. As the dimensions of the integrated circuit components are reduced, more elements are required to be placed in a given area on a semiconductor integrated circuit. Accordingly, the lithography process must be capable of forming mask layers which can be used to form even smaller features onto a substrate, and lithography must do this so precisely, accurately, and without damage to the underlying substrate or layers previously formed and processed thereon. In order to precisely and accurately transfer features onto a substrate, high resolution lithography may use a light source that provides radiation at short wavelengths. Short wavelengths help to reduce the minimum printable size on a substrate or wafer. However, short wavelength lithography suffers from problems, such as low throughput, increased line edge roughness, and/or decreased resist sensitivity.

In a recent development, an electrode assembly is utilized to generate an electric field on or through a photoresist layer disposed on the substrate prior to or after an exposure process so as to modify the chemical properties of the portion of the photoresist layer into which the electromagnetic radiation is transmitted, to improve the resolution of the developed resist features resulting from lithography exposure and development. In the process, an electrode is contacted with a fluid provided on the resist layer on a substrate held on a grounded pedestal, to allow current to pass through the resist layer or an electric potential applied to the resist layer. However, the challenges in implementing such systems have not been fully resolved. For example, the fluid is dispensed onto the substrate, after which the substrate, the electrode, or both are moved to position the fluid layer into contact with the substrate. It is known that during this positioning of the fluid layer to contact the electrode, gas present in the process chamber can become trapped as gas pockets between the electrode and the fluid, resulting in a discontinuous electric circuit between the resist layer on the substrate and the electrode across the face of the resist or electrode. This results in non-uniform processing of the resist layer over its surface. It is also known that the field guided post exposure bake process evolves gases which can also cause gas pockets which interfere with the passage of the electric current or imposition of the electric potential through the fluid present between the photoresist layer and the electrode, and result in non-uniform processing of the resist. Additionally, reaction byproducts of the process contacting the electrode surface in contact with the fluid can react therewith, locally changing the electrical characteristics of the electrode where the reaction product contacts the electrode.

Therefore, there is a need for improved methods and apparatus for improving photolithography processes.

SUMMARY

In one aspect hereof, a post lithography resist treatment apparatus for treating a substrate having a resist layer thereon with a fluid layer thereover includes at least one post exposure bake chamber comprising a substrate support having a substrate support surface thereon, and an electrode, the electrode comprising an electrode body having a substrate support facing side, the substrate support facing side having at least one recess extending inwardly thereof, and at least one projection adjacent to the recess having a substrate support facing surface thereon, wherein the substrate support is moveable to position a substrate, when supported thereon, such that a fluid layer disposed on the substrate contacts the substrate support facing surface of the projection but does not fill the recess with fluid, and the substrate facing surface of the electrode body is spaced from the substrate.

In another aspect, a method of performing post lithography resist treatment of a resist layer coated on a substrate, includes providing at least one post exposure bake chamber, the post exposure bake chamber including a substrate support and a fluid dispenser, positioning the substrate onto a substrate support having a substrate support surface thereon, and rotating the substrate support and dispensing a fluid onto the exposed resist coated surface of the substrate thereon during the rotation of the substrate support, providing an electrode, the electrode comprising an electrode body having a substrate support facing side, the substrate support facing side having at least one recess extending inwardly thereof and at least one projection, adjacent the recess, having a substrate support facing surface thereon, raising the substrate support to position the fluid layer disposed on the substrate in contact with the substrate support facing surface of the projection without filling the recess with fluid and maintaining a gap between the substrate facing surface of the electrode and the substrate, and powering the electrode.

In a further aspect hereof, a post lithography resist treatment apparatus includes at least two post exposure bake chambers stacked one over the other, each post exposure bake chamber including a substrate support having a substrate support surface thereon, and an electrode, the electrode having an electrode body comprising a substrate support facing side, the substrate support facing side having at least one recess extending inwardly thereof and at least one projection, adjacent the recess, having a substrate support facing surface thereon, wherein the substrate support is moveable to position a substrate, when supported thereon, such that a fluid layer disposed on the substrate contacts the substrate support facing surface of the projection but does not fill the recess with fluid, and the substrate facing surface of the electrode is spaced from the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
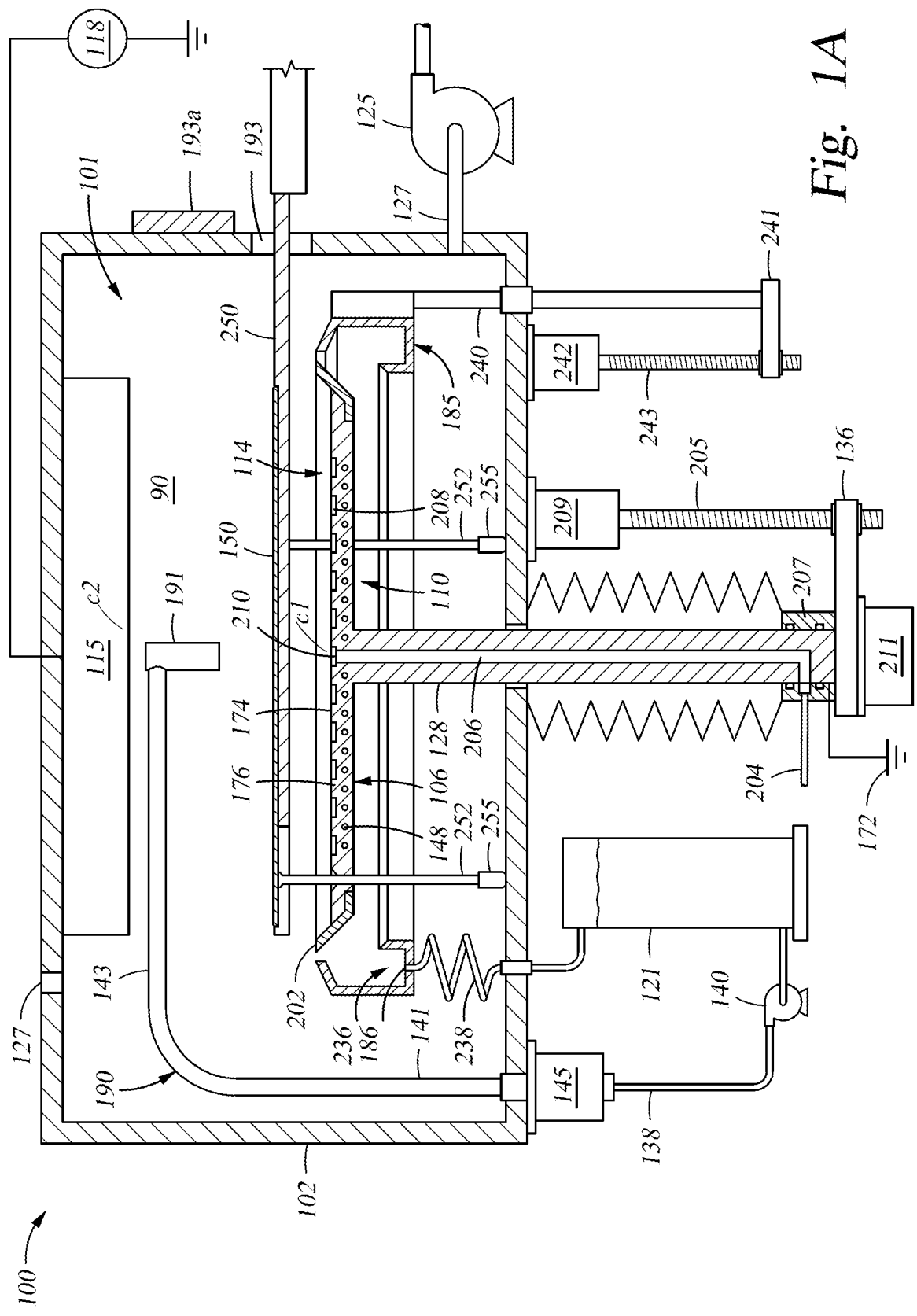
FIG. 1A Is a schematic sectional view of a field guided post exposure bake chamber with the components thereof configured to transfer a substrate thereinto or therefrom.

The present disclosure generally relates to methods and apparatus for post exposure bake processes, in particular a field guided post exposure bake process. Methods and apparatus disclosed herein assist in reducing line edge/width roughness and improve exposure resolution in a photolithography process for semiconductor applications.

The methods and apparatus disclosed herein improve the photoresist sensitivity and productivity of photolithography processes. The random diffusion of charged species generated by the photo acid generator in the chemically amplified resist during a post exposure bake procedure contributes to line edge and line width roughness and reduced resist sensitivity, which is ameliorated by the exposure thereof to a voltage potential or electric current during the post exposure bake process.

Among the several considerations regarding using an electrode to pass a current through a fluid present between the electrode and the photoresist layer or apply a potential thereto are the entrainment of gas bubbles in the fluid as it is dispensed onto the substrate, the trapping of chamber gas between the electrode and the fluid as the substrate is lifted to contact the fluid with the electrode, and the evolution of gas from the resist being electrically treated during the baking thereof, which can result in gas pockets of bubbles in the fluid being present across a portion of the electric circuit between the electrode and the resist layer through the fluid. These evolved gases can also react with the surface of the electrode, resulting in localized detrimental changes to the electrical properties of the electrode surface contacting the fluid. The presence of the gas pockets causes non-uniformities within the electric field applied to the resist layer and therefore increases the defectivity of the photoresist after the post-exposure bake process. For example, where gas is trapped between the fluid and electrode as they are brought into contact with one another, portions of the electrode where the trapped gas is present will not be in the electrical circuit with the resist, and non-uniform resist processing will occur. Likewise, where bubbles of evolved gas are buoyant in the fluid, they rise therein to contact the substrate facing side of the electrode, through which the electric field is applied to the substrate or the electric current is passing between the fluid and electrode. Although the substrate is rotating under the electrode, these bubbles or gas pockets formed as the fluid and electrode were brought into contact can become trapped between the substrate and the electrode, either at a specific locales on the electrode, or at a circumferential location thereon as they are induced to travel in the rotation direction of the substrate. The gas pockets are electrically insulating, and thus the presence of gas pockets causes differences in the total current or total potential voltage times the time of exposure thereto applied to different regions of the substrate and the photoresist layer thereon, resulting in differences in the clarity of the edges of the later developed lines and features of the photoresist. Likewise, detrimental evolved gaseous products of the baking of the photoresist can reach the electrode surface, locally detrimentally changing the electrical characteristics thereof. The present apparatus and methods described herein beneficially reduces the likelihood of gas pockets, including those with evolved gasses detrimental to the electrical characteristics of the electrode surface, being maintained between the photoresist layer and the electrode assembly, and thus differences in the resulting developed photoresist image across the face of the substrate.

Here, a patterned electrode assembly, such as those described herein, is utilized to apply an electric field to the photoresist layer during the post expose bake of the substrate and resist layer thereon. By using a patterned electrode assembly, wherein the electrode has extended regions which are in contact with the fluid medium, and recessed regions therebetween, gas evolved during the treatment process both as byproducts and as released air will pass through the fluid by natural buoyancy thereof in the direction of the electrode and into a recess region thereof and thereby not block the electric current flow between the substrate and the portion of the electrode in contact with the fluid where this gas as a gaseous byproduct or a gas pocket would otherwise remain. Where the gas is initially contacting an extended region of the electrode, the relative rotation of the electrode and substrate will result in these gases being swept to a recess region where their natural buoyancy can trap them.

In the aspects of a post exposure bake system herein, a process chamber generally includes a fixed electrode located over a rotatable, vertically moveable, substrate support. The electrode includes recesses extending inwardly thereof, such that projecting portions of the electrode where the recesses are not present can contact the electricity carrying fluid on the substrate, but any gas on the fluid, between the fluid and the projecting portions, or evolved during processing can reach a recessed portion. In some aspects, the electrode also includes relief passages, here in the form of slots or openings, which extend from the recesses to the non-substrate facing side of the electrode, such that an increase in the gas pressure in a recess, caused by increases in the amount of gas flowing into a recess, cannot occur as the gas is ventable therefrom.

Figure 1B:
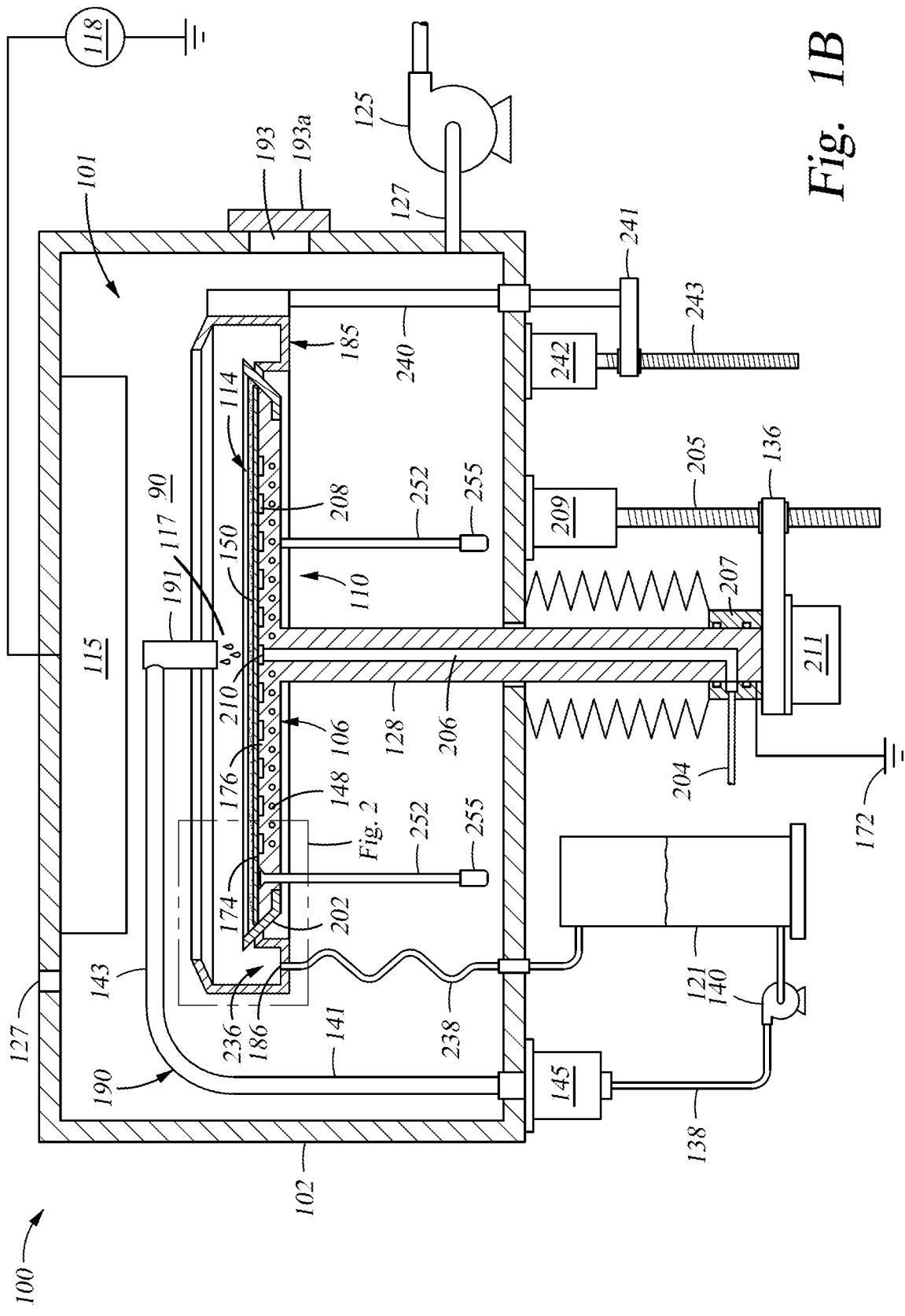
FIG. 1B is a schematic sectional view of a field guided post exposure bake chamber wherein the substrate support pedestal is positioned to receive a fluid on a substrate thereon, or to be rotated to accelerate the fluid from the substrate and into a catch ring.
Figure 1C:
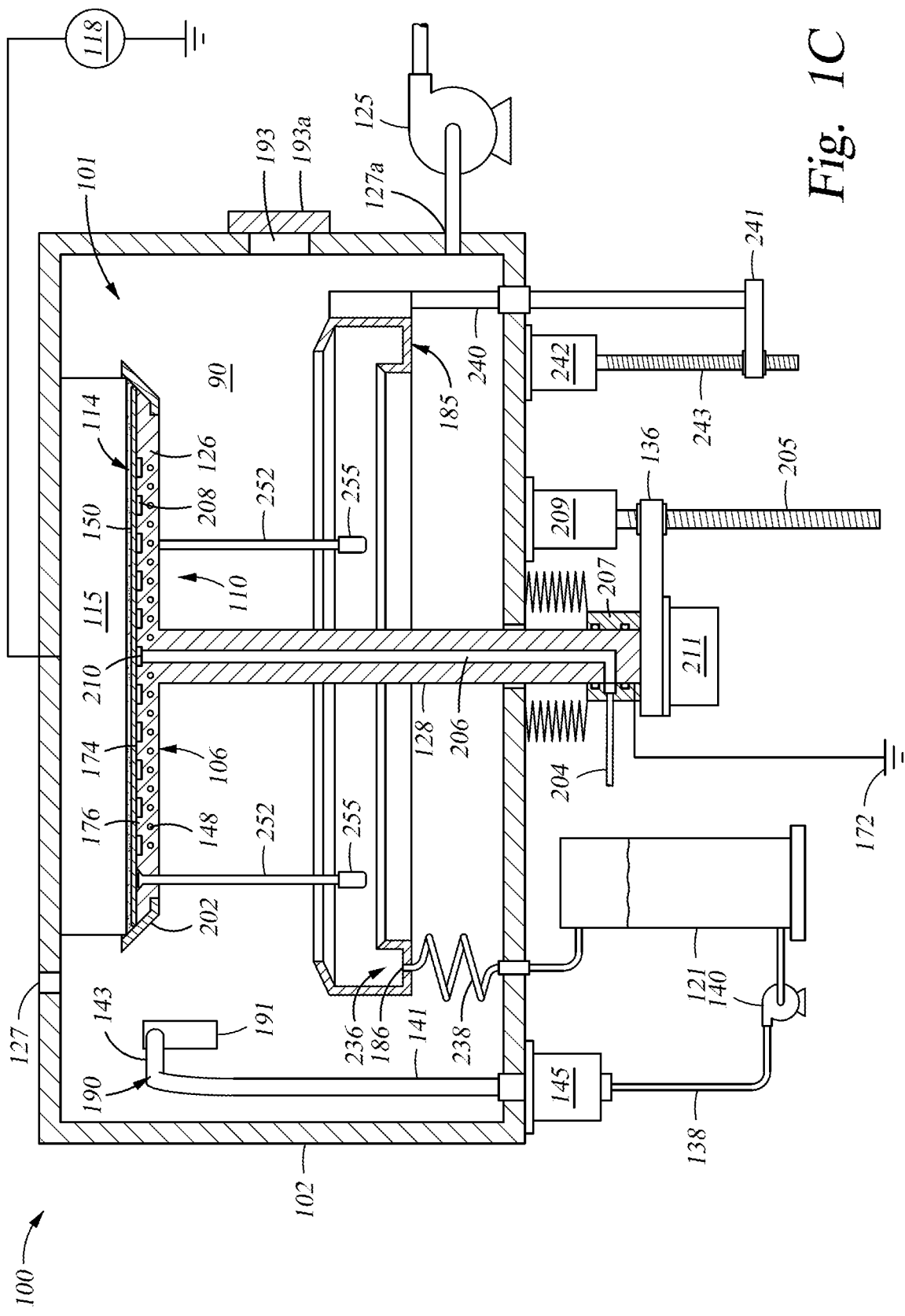
FIG. 1C is a schematic sectional view of a field guided post exposure bake chamber wherein the substrate support pedestal is positioned to extend the substrate and fluid thereover adjacent to a treatment electrode, such that the substrate facing surfaces of the support electrode are immersed in the fluid but spaced from the substrate.

FIGS. 1A, 1B and 1C are schematic cross-sectional views of an immersion field guided post exposure bake chamber 100 according to one embodiment described herein. The immersion field guided post exposure bake chamber 100 includes a substrate processing apparatus 101 and a module body 102 which provides a sealable enclosure for the substrate processing apparatus 101. An opening, or port 193 in the sidewall of the module body is provided for placement of a substrate into, or removal of a substrate from, the module body 102. A door 193a, shown open in FIG. 1A, is moveable located over the port 193 in the wall of the module body 102 to selectively seal the port 193 to isolate the volume within the module body 102 from the environment surrounding the module body 102 during substrate processing, and to open to allow substrates to be placed into, and retrieved from, the module volume of the module body 102. Here, the post exposure bake chamber 100 is generally configured to include a dispense arm 190 for dispensing a fluid onto the upper, resist coated, surface of a substrate 150, a pedestal 106 including a substrate support 176 configured to support and rotate the substrate 150 during the application of the fluid thereonto, during the application of an electric field thereto, and thereafter to remove the fluid. An electrode 115 is positioned over the substrate support 176 and configured to supply power as a desired voltage potential (voltage mode) or a desired current (current mode) through the fluid to the substrate 150, and, a catch ring 185 is positionable about the circumference of the substrate support 176 after processing of the substrate 150, such that rotation of the substrate support 176 can be performed at a sufficient rotational speed to cause the fluid on the substrate 150 to be accelerated off of the substrate 150 and into a trough 236 in the catch ring 185. A gas port 127 is provided through the wall of the module body 102 to provide gas into the module volume 90. Air, or a relatively inert gas such as Nitrogen or inert Argon can be introduced to the inner volume of the module body through the gas port 127. A pump port 127 likewise extends through the wall of the module body 102, and is connected to a suction source operable at a pressure lower than that in the module volume 90, for example a house exhaust of the fab where the chamber 100 is installed or a vacuum pump 125 such as a roughing pump. In FIG. 1A, the upper ends or heads of the support pins 252 are positioned above the substrate support 176 and a substrate 150 is shown positioned on the heads of these support pins 252. In this position, the substrate 150 can be placed into, or removed from, the module body 102 via the port 193 in the sidewall thereof using the end effector of a robot blade 250. In FIG. 1B the substrate 150 is positioned by the substrate support 176 to receive the fluid thereon prior to the processing thereof with the electric field, and the circumferential catch ring 185 surrounds the substrate support 176 to receive the fluid therein, as well as positioned when the fluid is accelerated off of the substrate 150 after the processing thereof. FIG. 1C shows the substrate support 176 fully lifted toward the electrode assembly 115, such that the fluid 117 on the substrate 150 contacts the electrode 170 of the electrode assembly 115 across the electrode facing surface of the substrate 150.

The substrate processing apparatus 101 includes the base assembly 110 and then electrode assembly 115. The module body 102 serves as a chamber body which surrounds the substrate processing apparatus 101 and forms the enclosed module volume 90 therein. The base assembly 110 and the electrode assembly 115 are disposed within the module volume 90. The base assembly 110 includes the substrate support 176 configured to receive and support a substrate thereon, such as the substrate 150 shown. The substrate support 176 is configured to hold the substrate 150 thereon, rotate the substrate generally about the center of the electrode facing side thereof, and to heat the substrate to a post exposure bake temperature, for example about 100° C. to about 150° C. or about 150° C. to about 500° C. The electrode assembly 115 is disposed opposite to and faces the base assembly 110, i.e., it faces the base assembly 110 and thus the substrate support 176 at the location thereof where the substrate 150 is located and is configured to apply an electric field to the substrate 150 and thereby perform a field guided post exposure bake process the substrate 150 disposed thereon as will be further described herein. The volume between the electrode assembly 115 and the substrate 150 when the substrate 150 is lifted to the position thereof in FIG. 1C forms a process volume 114 and the process volume 114 is filled with a process liquid, here a fluid capable of electric current passage therethrough during substrate processing. This fluid can be for example a fluid in liquid phase with a boiling point above 150° C., a resistivity range $10^7$-$10^{12}$ Ωcm, low reactivity with photo resist, for example a highly resistive fluid based on a fluorocarbon like Galden® or fluoroinert. The center $C_2$ of the electrode 115 assembly, and thus of the substrate facing side thereof, is in some aspects hereof offset radially from the center of rotation $C_1$ of the substrate support 176. The pedestal 106 includes a rod shaped pedestal support shaft 128, the centerline of which passes through the center of rotation $C_1$ of the substrate support 176, and upon which the substrate support 176 is supported.

Figure 2:
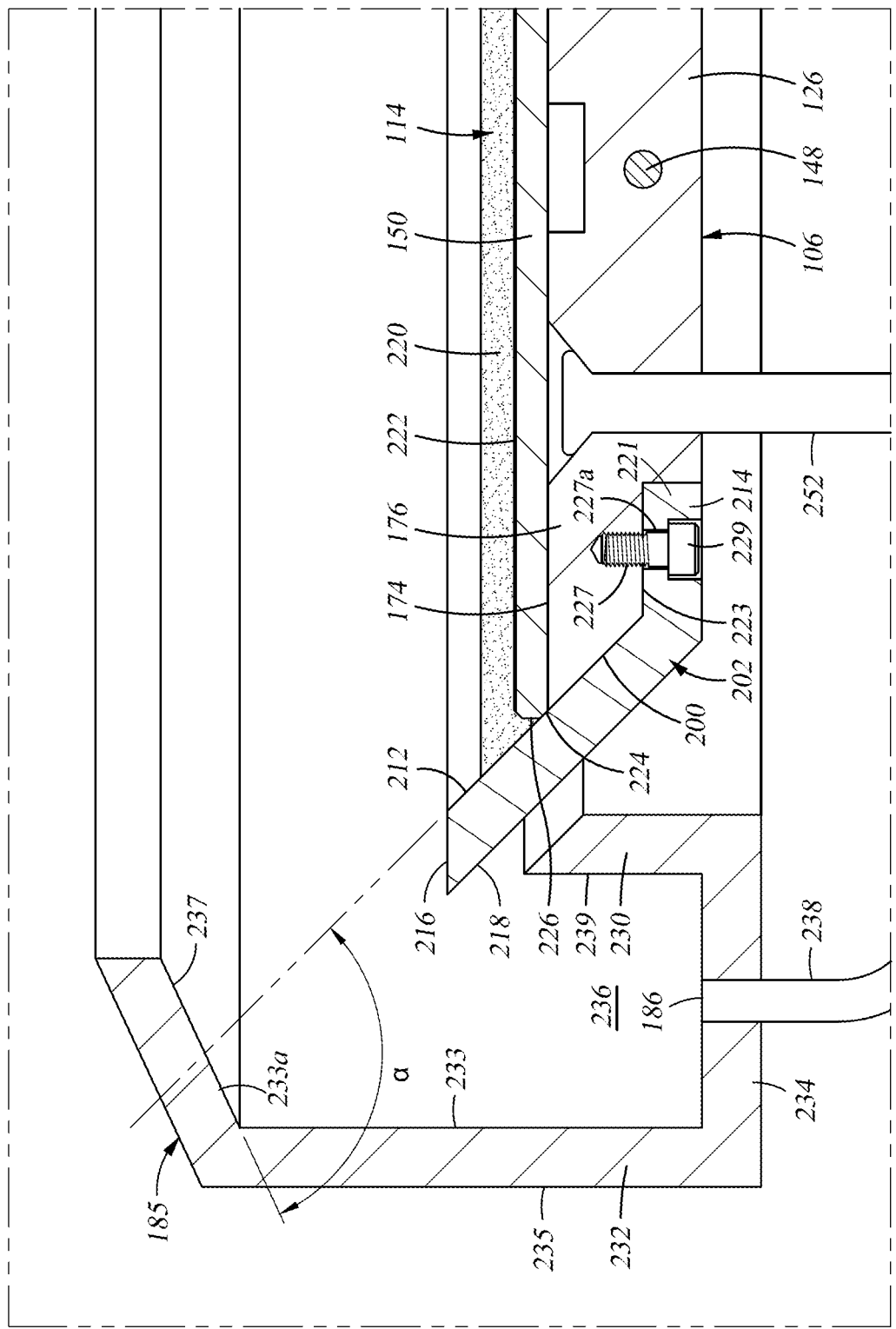
FIG. 2 is an enlarged view of the outer circumferential portion of the substrate support pedestal 106 and an adjacent portion of the catch ring as they are position in FIG. 1B.
Figure 3:
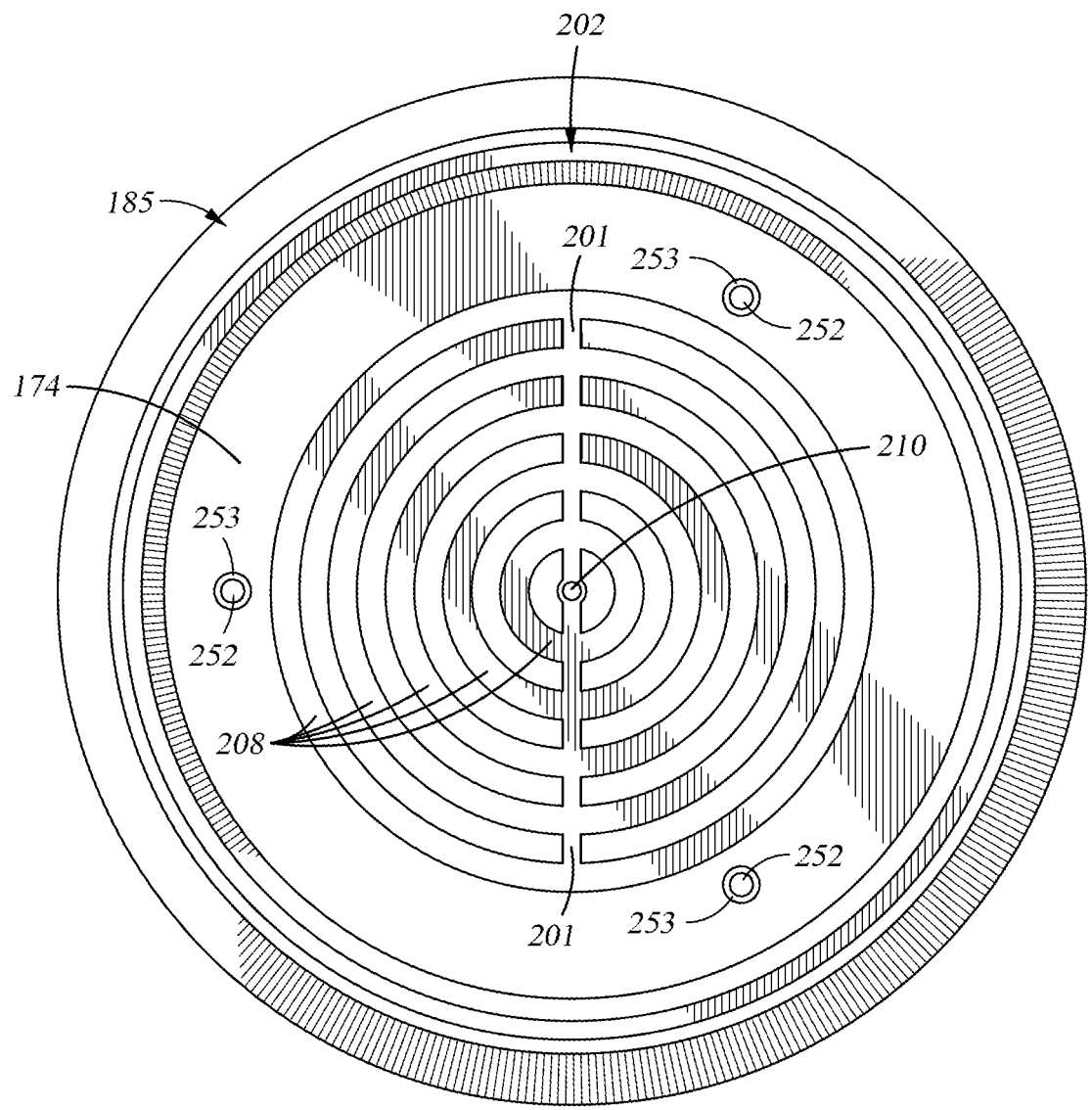
FIG. 3 is a plan view of the substrate receiving surface 174 of the substrate support pedestal.
Figure 4:
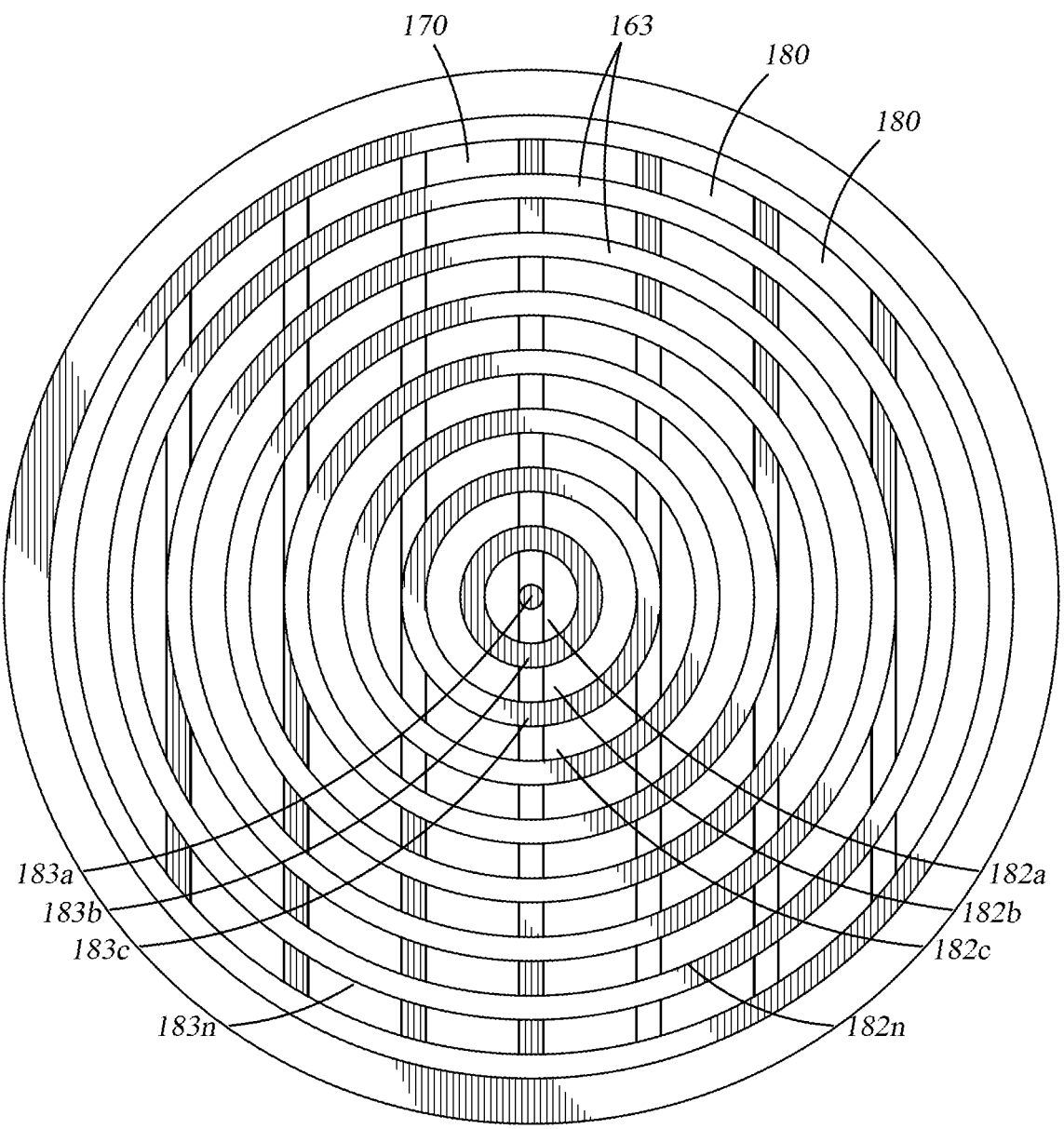
FIG. 4 is a plan view of the substrate facing side of an electrode hereof, showing a plurality of nested annular grooves and recesses extending therebetween and into the substrate facing surface of the electrode.

The base assembly 110 includes the substrate support 176 supported on the rod shaped pedestal support shaft 128, and having a substrate support surface 174 on the electrode assembly 115 facing side thereof and on which the substrate 150 is supported. As shown in FIGS. 1C and 3, the substrate support 176 is a generally disk shaped member having an outer peripheral circumferential surface 200 (FIG. 2). An edge ring 202 which functions as a circumferential fluid dam is coupled to the outer peripheral circumferential surface 200 of the pedestal 106. The inner surface of the edge ring 202 forms the circumferential outer boundary of the process volume 114. The substrate support surface 174 is the upper surface of the substrate support 176, in other words, the surface of the substrate support 176 which faces the electrode assembly 115. Here, the substrate support 176 is configured as a vacuum chuck, wherein a vacuum line 204 is coupled, through a rotary union 207 to a vacuum passage 206 in the pedestal support shaft 128 which opens at the substrate support surface 174. The substrate support surface 174 includes a plurality of circular grooves 208 generally centered on the opening 210 of the vacuum passage 206 at the substrate support surface 174, and a plurality of radial grooves, here two radial grooves 201, extending radially from the opening 210 of the vacuum passage 206 opening 210 at the substrate support surface side thereof and inwardly of the substrate support surface 174. When a substrate is located on the substrate support surface, a slight vacuum on the order of 100 to 250 torr less than the pressure within the module volume 90 is pulled through the vacuum line 204 and vacuum passage 206. The vacuum results in the substrate 150 being pulled against the surfaces of the non-grooved portions of the substrate support surface 174, or pushed thereagainst by the higher pressure in the module volume 90. A plurality of substrate support pins 252, having enlarge upper heads, extend through pin openings 253 (FIG. 3) extending through the pedestal. The lift pins 252 terminate below the support pedestal 106 with enlarged landing pads 255. With the support pedestal 106 in its lowest position within the module body, as shown in FIG. 1A, the heads of the pins 252 extend above the substrate support surface 174, because the landing pads 255 engage the base of the module body 102. In this position, a substrate 150 can be placed on, or removed from, the heads of the pins 252. As the substrate support pedestal 106 is moved in the direction of the electrode 115, the heads of the pins 252 become recessed into the substrate support surface 174 in an enlarged upper portion of the pin openings 253, and the enlarged landing pads 255 are lifted off of the base of the module body 102. The landing pads 255 may alternatively be fixed to the base of the module body 102, in locations where the lower ends of the lift pins 252 will contact them as the substrate support 174 is lowered.

The substrate support pedestal 106 and edge ring 202 are configured so that the outer circumferential surface of the substrate 150 can be engaged against the inner surface of the edge ring 202 to form a circumferential seal between the edge of the substrate 150 and the edge ring 202, to prevent fluid from contacting the support surface 174 when present on the substrate 150 surface facing the electrode 115 as shown in FIG. 2. The substrate support pedestal 106 includes a support body 126 forming at the upper surface thereof the substrate support surface 174 and the shaft 128 extending from the side thereof opposite of the substrate support surface 174. The vacuum passage 206 extends therethrough to supply the vacuum between a substrate 150 and the substrate support surface 174. The edge ring 202, disposed circumferentially around the substrate support pedestal 106, includes an inner outwardly extending frustoconical surface 212, a lower attachment portion 214, an upper annular surface 216, and an outer frustoconical surface 218. The inner outwardly extending frustoconical surface 212 of the edge ring 202 extends beyond and above the substrate support surface 174 a distance greater than the thickness of a fluid layer 220 which is formed over the substrate 150 during processing thereof, where the fluid is used as the conductive path between the electrode 115 and the substrate 150, including a resist layer 222 on the substrate 150. The outer circumference of the pedestal 106, is configured such that the bevel 224 on the side of the substrate facing the substrate support surface 174 of the pedestal 106 extends outwardly thereof and the bevel 224, or the intersection of the bevel 224 and the outer circumferential face 226 of the substrate 150 engage against the inner outwardly extending frustoconical surface 212 of the edge ring 202. Alternatively, a seal ring grove can be extended inwardly of the substrate support surface 174 side of the support pedestal 106 at a location adjacent to the outer circumference thereof, and a seal ring provided therein to seal against the substrate support facing side of the substrate 150.

The substrate support 176 includes at the lower outer circumference thereof an annular recess 221 having an upper annular recess wall 223, from which the outer peripheral circumferential surface 200 of the substrate support pedestal 106 extends upwardly and outwardly to meet the substrate receiving surface 174 of the support pedestal 106. A plurality of through openings 227a (only one shown) extend through the lower attachment portion 214 of the edge ring 202 and into mating threaded openings 227 extending inwardly of the upper annular recess wall 223 of the support pedestal, and a plurality of threaded fasteners 229 extend thereinto to secure the edge ring 202 to the support pedestal 106. The outwardly extending frustoconical surface 212 of the edge ring 202 is thus brought into facing contact with the outer peripheral (frustoconical) circumferential surface 200 of the substrate support pedestal 106.

The catch ring 185 is configured to receive the fluid and isolate the fluid from the module volume 90 after the substrate 150 has been treated using the electrode assembly 115. After the substrate 150 is processed by the application of the electric field via the electrode 170 of the electrode assembly 115, the substrate support pedestal 106 is lowered, and the catch ring 185 is lifted, to the positions thereof in FIGS. 1B and 2, to position the catch ring 185 circumferentially around the substrate support 176 while the support pins 252 are still suspended in the substrate support pedestal and thus spaced above the base of the module body 102. The catch ring 185 is a generally annular member, having a circumferential inner wall 230 and a circumferential outer wall 232, wherein the lower portion of the outer wall 232 is disposed at a 90° angle directed upwards from an annular base 234 of the catch ring 185, the inner surface 233 thereof extending a height or distance therefrom sufficient to, in conjunction with the inner surface 239 of the inner wall 230, form a trough 236 to catch and capture liquid accelerated off of the substrate 150 by rotation thereof on the substrate support pedestal 106. This liquid will flow down the sides of the inner surface 233 of the outer wall into the trough 236 of the catch ring 185.

During the rotation of the substrate pedestal 106 to accelerate the fluid off of the surface of the substrate 150, the liquid is accelerated to flow across the inner outwardly extending frustoconical surface 212 of the edge ring 202, which guides the flow of the liquid against the inner sidewall 233 of the outer wall 232 of the catch ring 185 which is cooperatively arranged for this purpose. Thus, the catch ring outer wall 232 includes a lower outer wall 235 extending from the annular base wall 234 a greater distance than does the catch ring inner wall 230 thereof from the annular base 234 of the catch ring 185, and an upper wall 237, the portion of the outer wall inner surface 233a thereof angled radially inwardly toward the center of the catch ring 185. The angle α formed between the lower side of the plane of the inner outwardly extending frustoconical surface 212 of the edge ring 202 with the inner surface 233 portion of the upper wall 237 is greater than 90°, which helps ensure that the liquid accelerated off of the substrate 150 and guided toward the catch ring 185 along the directional vector of the plane of the inner outwardly extending frustoconical surface 212 of the edge ring 202 will tend to flow downwardly along the inner surface 233 and into the trough 236. Although the upper wall 237 intersects the outer wall 232 at an angle, the inner surfaces 233a, 233 thereof may blend together as a continuous curve. A catch ring drain opening 186 connects the trough 236 of the catch ring 185 to a fluid reservoir 121 (FIGS. 1A to 1C) through a catch ring drain line 238. Liquid collecting in the trough 236 flows through the catch ring drain 186 into the reservoir 121 through the catch ring drain line 238.

The catch ring 185 is supported by a support shaft 240 extending through sealed opening through the base of the module body 102. A bellows or other structure, not shown, is used to seal the opening. The portion of the support shaft 240 disposed therethrough is coupled to a ring driver support plate 241, which is threadingly coupled to a first threaded shaft 243. The first threaded shaft 243 is rotatable about the longitudinal axis direction thereof and is turned or rotated about its longitudinal axis in two directions by a catch ring motor 242. Rotation of the first threaded shaft 243 in the first direction causes the ring driver support plate 241 to move away from the base of the module body 102 and lower the ring support shaft 240, and thus the catch ring 154, within the module volume 90. Rotation of the first threaded shaft 243 in the opposite, or second direction causes the ring driver support plate 241 to move toward the base of the module body 102 and raise the ring support shaft 240, and thus the catch ring 154, within the module volume 90. Here, the catch ring 185 is locatable in a recessed or lowered position as shown in FIG. 1C where it is entirely below the port 193, and in a fluid capture position as shown in FIG. 1B. In the fluid capture position, the upper surface 216 of the edge ring 202 is at least at the same elevation, or greater, from the base of the module body 102 as the port 193, and the support pedestal 106 is lifted to a position sufficient to lift the enlarged landing pads 255 of the support pins 252 or the support pins 252 themselves when the landing pads 255 are affixed to the base of the module body 102, off of the base of the module body as shown in FIG. 1B. Thus, when the substrate support 176 rotates at an angular velocity to accelerate the fluid to a sufficient velocity to reach the catch ring 185 and flow along the inner surface 233 of the outer wall 232 into the trough 236, the landing pads 255 are located in free space above the base of the module body 102 allowing the substrate support 176 to rotate without interference of the support pins 252 with the base of the module body 102.

The substrate support pedestal 106, and thus the substrate support surface 174, is moved toward and away from the electrode 115 by the movement of the pedestal support shaft 128 through a sealed opening through the base of the module body 102. Again here, the opening is sealed using a bellows, not shown, or other sealing arrangement. The support shaft 128 is supported, exteriorly of and below the module body 102, on a pedestal support plate 136. The pedestal shaft 128 is coupled to the bottom surface of the substrate support 176 portion of the substrate support pedestal 106. The shaft 128 extends from the module volume 90 through an opening within the module body 102. The shaft 128 enables the pedestal 106 structure, and thus the substrate support 176 thereof, to be moved between a substrate loading position (FIG. 1A), a process position thereover (FIG. 1C), and a fluid removal position (FIG. 1B) intermediate of the substrate loading and the substrate processing positions. The portion of the pedestal shaft 128 extending outwardly of the module body 102 is supported on the pedestal support plate 136. The pedestal support plate 136 includes a threaded opening therethrough, through which a second threaded shaft 205 is threadingly extended therethrough. The second threaded shaft 205 is coupled to a pedestal lift motor 209. The pedestal lift motor 209 moves or rotates the second threaded shaft 205 about its longitudinal axis in a first and an opposite second direction. As the second threaded shaft 205 rotates in the second direction, the pedestal support plate 136 and thus the attached pedestal shaft 128 and the substrate support 1761 is raised. As the second threaded shaft 205 is rotated in the opposite, first direction, the pedestal shaft 128, and the thus the substrate support 176, retract away from the electrode 115 assembly. The portion of the shaft 128 extending underneath the module body 102 is also connected to a pedestal rotation motor 211 supported on the pedestal support plate 136. The pedestal rotation motor 211 supported on the substrate support plate 136 is coupled to the base of the pedestal shaft 128 by a drive shaft thereof (not shown). The pedestal rotation motor 211 rotates the pedestal shaft 128 and thus the substrate support pedestal 106 at a rotation speed such as 60 rpm during the processing of the substrate 150 with the electrode 115 and electric field, or at 120 rpm during the removal of the fluid from the substrate 150.

The substrate support 176 is electrically connected to ground 172 via the pedestal shaft 128 and thus electrically grounded. Grounding the substrate support 176 enables better control of the electric field between the electrode assembly 115 and the substrate 150. The connection to ground 172 is, for example, via slip rings on a rotary union 207 on the pedestal shaft 128 as shown in FIG. 1B. The substrate support 178 is configured of an electrically conductive material, with an electrical resistivity of less than about $1\times10^{-3}$ $\Omega\cdot$m, such as less than $1\times10^{-4}$ $\Omega\cdot$m, such as less than $1\times10^{-5}$ $\Omega\cdot$m. The contact resistance between the substrate support 176 portion of the pedestal 106, and the substrate 150, has a greater impact on the ability of the pedestal 106 to electrically ground the substrate 150 than the resistivity of the pedestal 106 itself. In embodiments described herein, the contact resistance between the substrate support 176 and the substrate 150 is less than about $1\times10^{-3}\Omega$, such as less than about $1\times10^{-3}\Omega$. In some embodiments, the substrate support 176 is a conductive ceramic or metal such as an aluminum, a silicon carbide, a doped silicon carbide, or a dopes silicon material.

One or more heating elements 148 are disposed in the substrate support 176 below the substrate support surface 174. The one or more heating elements 148 are, for example, cable heaters forming two or more annular heating zones about the center of the support surface 174 to heat the substrate on the substrate support surface 174 to a uniform post exposure bake temperature. The heating elements 148 are disposed adjacent to, and immediately below, the substrate support surface 174 to reduce the thermal mass between the resistive heating elements and the substrate 150. This increases the speed at which the resistive heating elements heat the substrate 150 during processing. The resistive heaters are electrically powered, and the power is supplied via wiring extending through the pedestal support 128 and connected, by slip rings (not shown), to a variable power supply (not show).

A chemical dispense arm 190 is fluidly connected to the reservoir 121 through a feed line 138 and a pump 140 to dispense liquid from within the reservoir 121 onto a substrate 150 supported on the pedestal 106. The dispense arm 190 is a generally "L" shaped tube, having a first portion 141 extending inwardly of the base of the module body 102 through a sealed opening sealed by a bellows (not shown) or other seal, and a second portion 143 extending therefrom within the module body 102 and generally parallel to the substrate support surface 174 of the pedestal 106 and terminating at a nozzle 191. A dispense arm motor 145 is coupled to the end of the first portion extending outwardly of the module body 102, and is controlled to rotate the first portion 141 of the dispense arm 190 to position the second portion 143 thereof relative to the substrate 150 on the substrate support pedestal 106 and relative to the adjacent sidewall of the module body 102. The second portion 143 of the dispense arm 190 is moveable such that it is either arranged to extend generally parallel to the adjacent wall of the module body 102, or extend over a substrate 150 on the substrate support surface 174 of the pedestal 106, such that the nozzle 191 is disposed directly over the center of the substrate 150. In the location thereof in FIG. 1B, fluid 117 is dispensed from the reservoir 121 and through the nozzle by pumping action of the pump 140, while the substrate is rotated at a desired speed about its center $C_1$, to spread the fluid 117 over the resist layer coated on the substrate 150.

In one aspect, as shown in FIGS. 4 to 7 hereof, the electrode assembly 115 includes an electrode 170 and a hood 104 disposed around and covering at least a portion of the electrode 170, the hood 104 covering the upper side of the electrode 170 and supporting the electrode 170 off of the upper wall of the module body 102. The electrode 170 is configured, for example, as a conductive mesh or a finely perforated electrode plate. The electrode 170 is permeable to allow gas to pass therethrough, for example through perforations, mesh, pores, or other gas permeable structures. The electrode 170 is utilized in order to reduce the number and size of gas bubbles or gas pockets which would otherwise become trapped under the electrode assembly 115 as the electrode assembly 115 is submerged into the process fluid, and resulting from gas evolved from the resist layer during the field guided post exposure bake thereof. The electrode 170 in some embodiments is configured of a non-metal electrically conductive material, such as a silicon carbide, such as a doped silicon carbide. In other embodiments, the electrode 170 is configured of a conductive metal, such as a copper, aluminum, platinum, or a steel. The electrode 170 is electrically coupled to a first power source 118. The first power source 118 is configured to apply power to the electrode 170. In some embodiments, an electrical potential of up to 5000 V is applied to the electrode 170 by the first power source 118, such as less than 4000 V, such as less than 3000 V.

Figure 5:
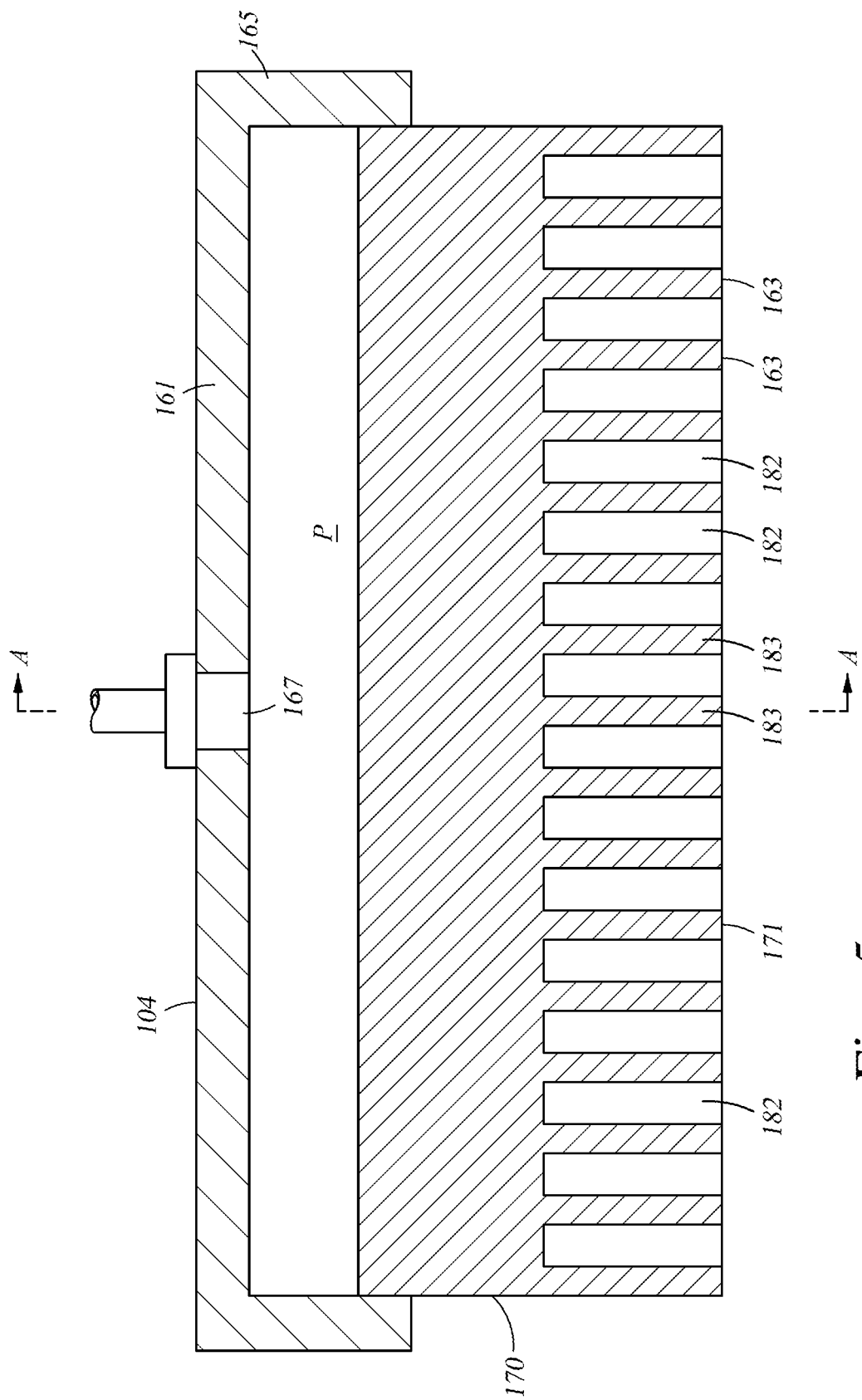
FIG. 5 is a sectional view of the electrode of FIG. 4 at section B-B.
Figure 6:
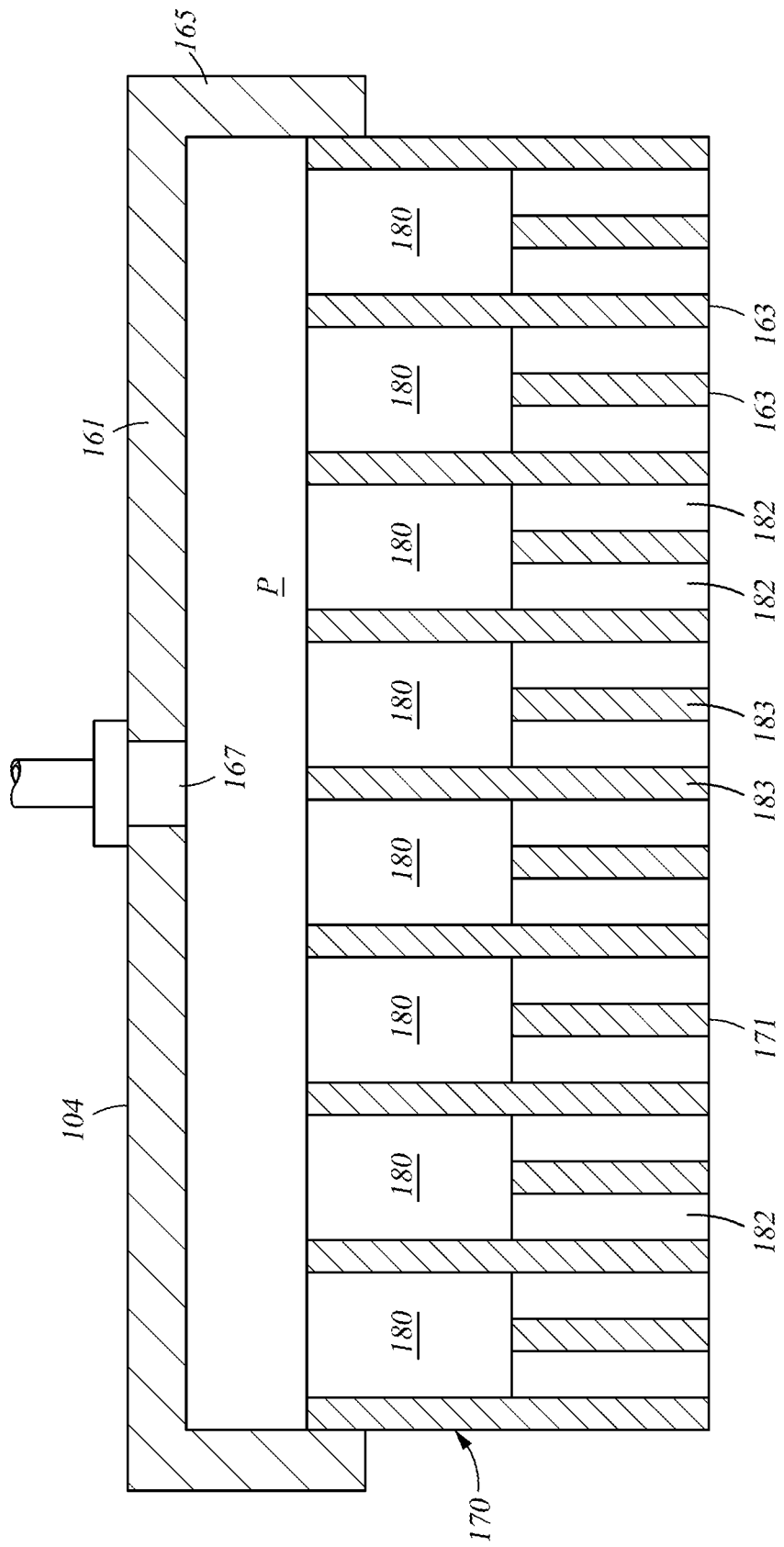
FIG. 6 is a sectional view of the electrode of FIG. 5 at section A-A.
Figure 7:
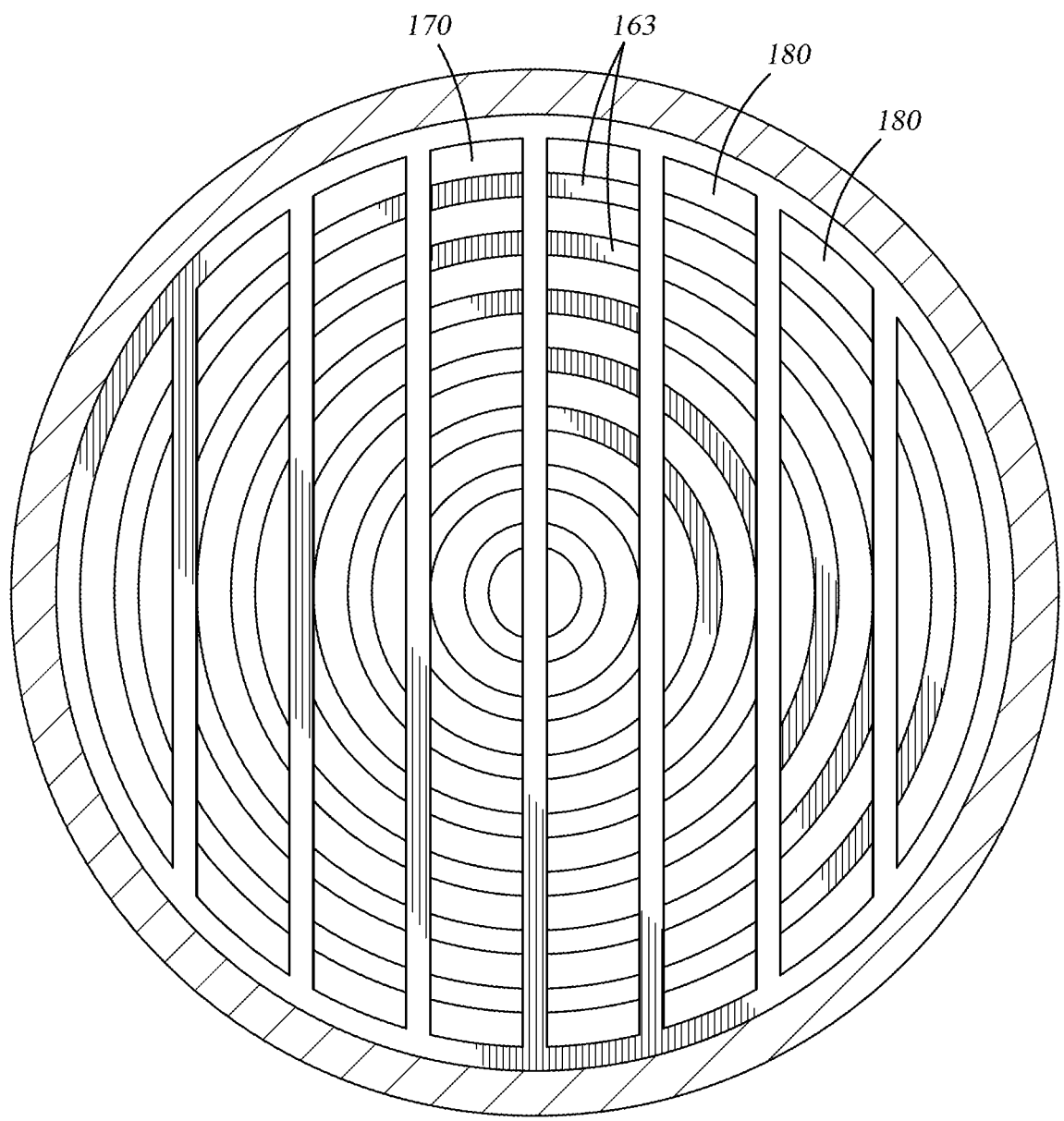
FIG. 7 is a plan view of the surface of the electrode facing away from the substrate, showing a plurality of vent grooves extending inwardly thereof and selectively intersecting the annular passages extending inwardly of the substrate facing side of the electrode to prove gas relief passages from the recess.

In one aspect as shown in FIGS. 4 to 7, the substrate facing face 171 of the electrode 170 contains a pattern of vent channels 182 as the recesses and protrusions 183 covering the entirety of the substrate facing face 171 of the electrode 170. In this aspect of the electrode 170, a plurality of circular channels 182a-n, where n is a whole number integer, extend inwardly of the substrate facing face 171 of the electrode 170, and these circular vent channels 182 are annularly spaced apart by circular protrusion 181a-n, and are located from the center of the substrate facing face 171 of the electrode 170 such that the outer circumferential surface of the electrode 170 extends into the nth projection 181n, generally extending as a right annular projection. Here, for clarity, only seven channels are shown, it being understood that a greater or lesser number thereof may be employed. At the center of the electrode 170 is a protrusion 183a having a diameter D surrounded by a first annular vent channel 182a. The next annular channel 182b is formed the radial span of diameter D away from and outwardly of the first annular channel, thus forming a second right annular protrusion 183b following a circular path centered on the first protrusion 181a. This pattern continues, with each additional protrusion 181c-n having a width, in the radial direction from the central protrusion 181a, of diameter D. Each vent channel 182a-n channel has a depth extending inwardly of the electrode 170 of for example 0.1 mm to on the order of 2.0 to 3.0 cm, such that the protrusions 183 extend to a height away from the substrate facing face 171 the same distance as the depth of the annular channels 182. Inwardly of the non-substrate facing face 177 of the electrode 170 extend a plurality of longitudinal exhaust channels 180, separated by longitudinally extending fins 181 as shown in FIGS. 6 and 7. These exhaust channels 180 extend in a generally straight line path and terminate at their opposed ends inwardly of the outer cylindrical surface of the electrode 170. The exhaust channels extend across the vent channels 180 and intersect with them inwardly of the electrode 170 to form a vent passage for the gas evolved during processing of the substrate 150. The material of the fins 181 contacts and supports the material of the protrusions 181*a-n*. For example, the electrode 170 can be machined from a solid block of a material such that the fins 181 and protrusions 183 are of a contiguous portion of the material stock. The exhaust channels 180 here open at the non-substrate facing face 177 of the electrode 170. Here, the hood 104 includes a circumferential flange 165 and a generally circular, in plan view, ceiling 161 spaced from the non-substrate facing face 177 of the electrode 170, to form a plenum "P" over the adjacent vent channels 180. This plenum P is coupled through an exhaust opening 167 in the ceiling 161 to an exhaust, for example the factory exhaust system leading to a scrubber, to allow the gas evolved during field guided post exposure bake of the resist layer to escape from the module body 102. Absent this exhaust paradigm, where a large volume of gas is evolved from the resist layer, it could be possible to fill one of the vent channels 180 and thereby allow gas to aggregate on the electrode surface facing the substrate 150 and disrupt the uniformity of processing of the resist layer. The vent channels 180 here are positioned in parallel to one another so that the longest vent channel 180 extends generally across the center of the electrode 170, with each of the vent channels 180*n* sequentially positioned on either side of this longest channel 180*a* being smaller in length than the one adjacent thereto on the longest channel 180*b* side thereof. The end of each vent channel 180 is spaced from the outer circumferential surface of the electrode, and is curved in to follow the contour of the outer circumferential surface of the electrode 170.

Figure 8:
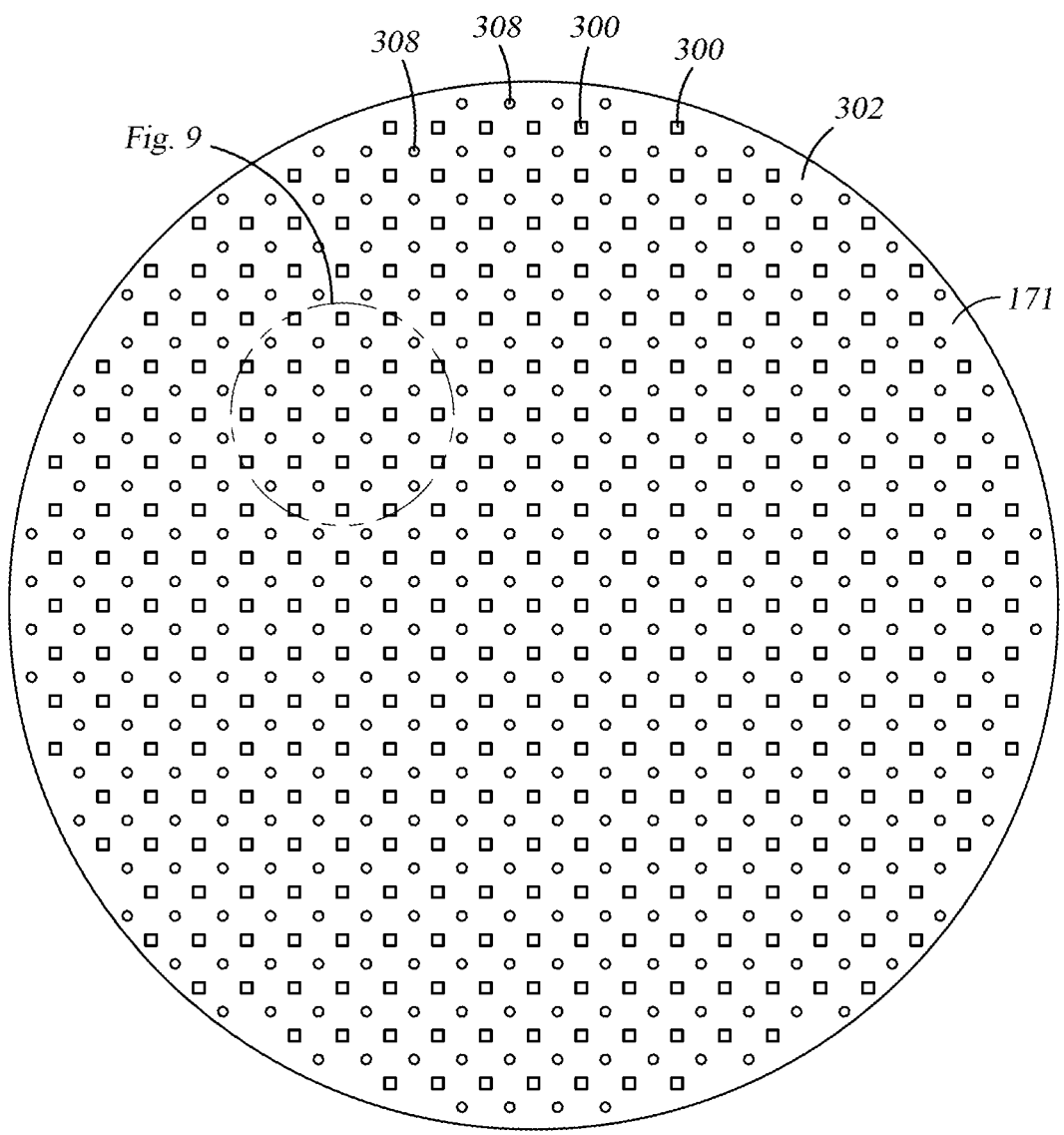
FIG. 8 is a plan view of the substrate facing side of an additional electrode construct having a plurality of needle like mesas facing a substrate on the substrate support.
Figure 9:
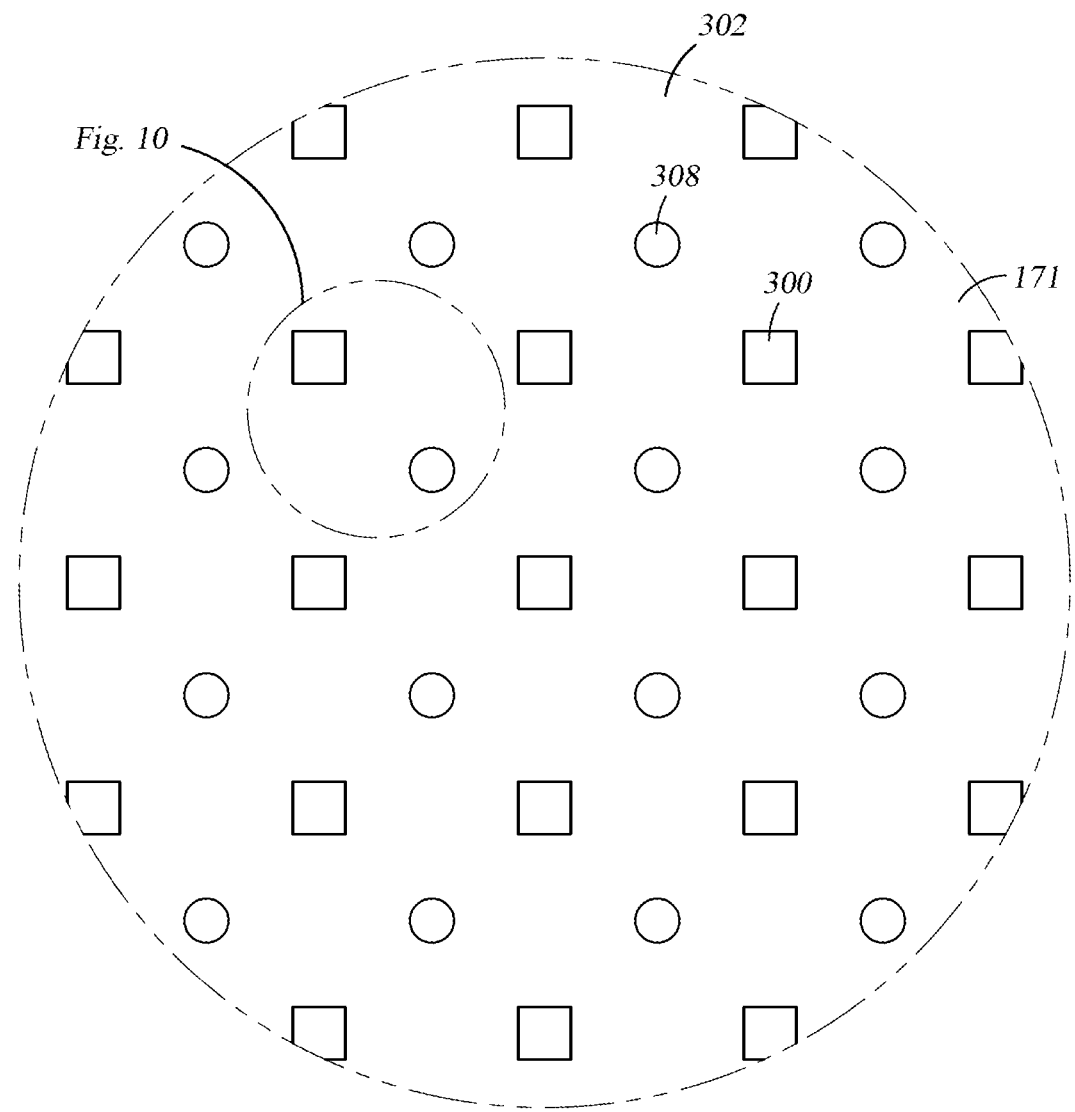
FIG. 9 is an enlarged view of the substrate facing side of the electrode of FIG. 8, showing a plurality of mesas on, and adjacent vent openings through, the electrode.
Figure 10:
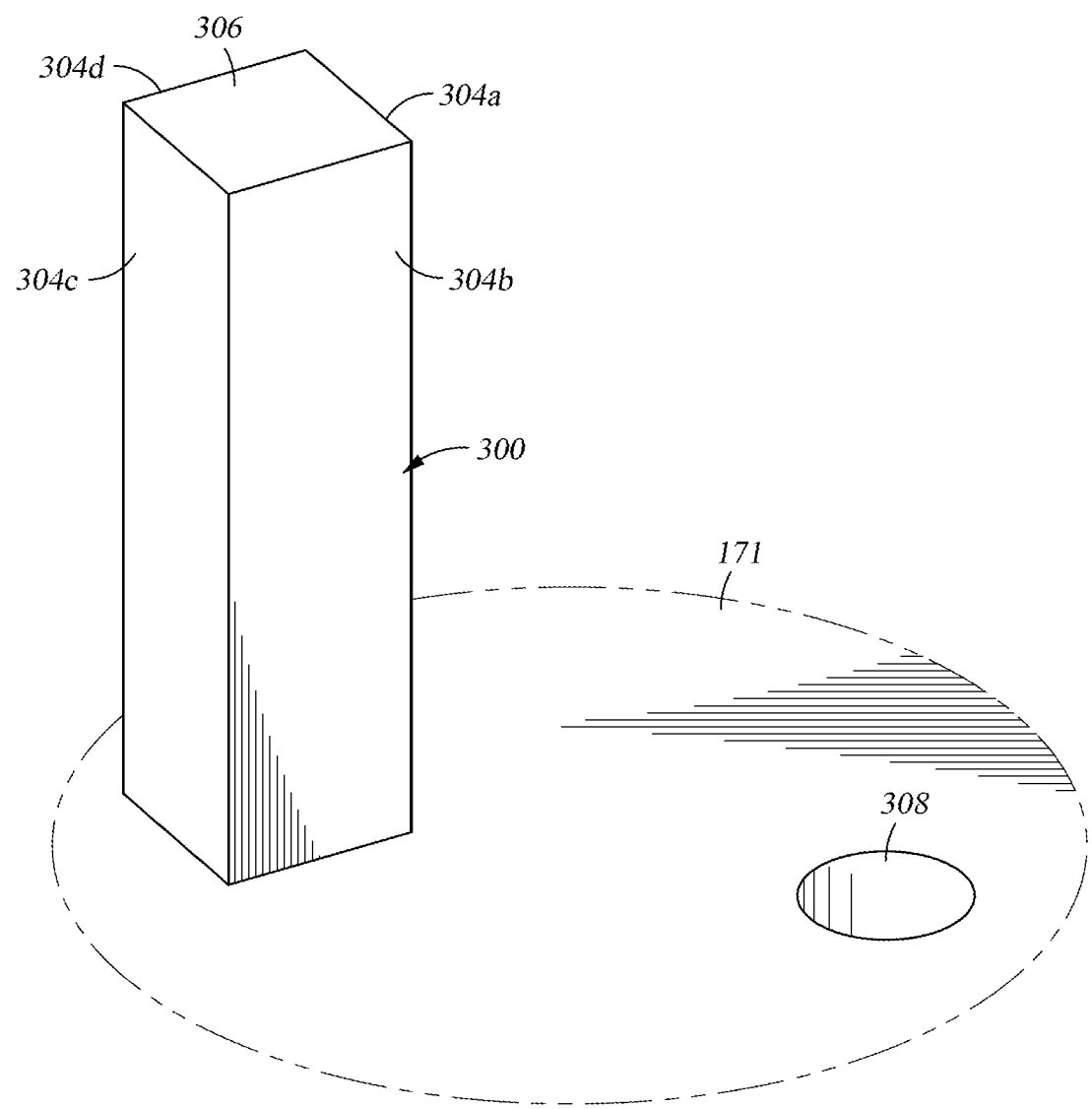
FIG. 10 is an enlarged isometric view of an individual mesa of FIGS. 8 and 9.

FIGS. 8 to 10 show certain details of another aspect of the electrode assembly 115 wherein a needle electrode 170' is provided and it includes as projections a plurality of needle like mesas 300 extending from a base surface 302 of the needle electrode 170'. As best shown in FIG. 10, the mesas 300 here are each rectangular in section, having four outer walls 304*a-d*, each of the adjacent outer walls disposed at an approximately 90° angle to one another. Opposed walls 304*a, c* have a width of x, and the opposed walls 304*b,d* have a width of y, where x and y are on the order of 0.1 mm to two to three cm. Here, each mesa 300 includes a substrate facing mesa surface 306 having a surface area of x times y, as the surface thereof distal to the base surface 302 of the needle electrode 170'. The substrate facing mesa surfaces 306 of the mesas 300 are coplanar with one another within machining tolerances. The substrate facing mesa surfaces 306 are disposed inwardly of the fluid 117 when the substrate is positioned as shown in FIG. 1C and provide the electrical connection of the electrode 170' with the fluid 117 on the substrate 150. Here, the mesas 300 extend as a contiguous extension of the electrode 170' from the base surface 302, for example by the mesas 300 being machined into a planar electrode surface. The mesas may also be otherwise adhered to the base surface 302, such as by being configured as pins that extend inwardly of the base surface 302, or other connection paradigms. The mesas 300 are shown, in FIG. 8, to be arranged in a rectangular grid pattern and evenly spaced from one another along interstices of the rectangular grid, although other arrangements of mesas 300 extending from the base 302 of the needle electrode 170', such as a triangular or polygonal grid, and non-uniform spacings therebetween, are contemplated.

Here, the ratio of the collective sum of the surface areas of the substrate facing mesa surfaces 306 to the sum of the collective sum of the surface areas of the substrate facing mesa surfaces 306 and the area of the base surface 302 extending therebetween from which they extend is one the order of 0.2 to 0.8, i.e., 20 to 80% of the total area of the needle electrode 170' on the side thereof facing the substrate 150 is the substrate facing mesa surfaces 306.

Here, the open space between the protrusions, i.e., between the mesas 300 is open across the circumference of the needle electrode 170', such that it is unlikely that sufficient gas evolved from the resist during the field guided post exposure bake process can fill this large open area to extend over a substrate facing mesa surface 306. However, vent holes 308 can be provided through the base 302 of the electrode 170'. Like the electrode 170 of FIGS. 5 to 8, the needle electrode 170' is coupled to the hood 104 to provide an exhaust plenum such as plenum P as shown in FIGS. 5 and 6 hereof over the back side of the needle electrode 170' into which these vent holes 308 communicate, and the plenum can likewise be exhausted to a house exhaust or other exhaust. The needle electrode 170' is connected to the hood 104 in the same manner as electrode 104.

The hood 104 is electrically insulating. For example, the hood 104 is made from an electrically insulating material that reduces the flow of electric fields therethrough. The hood 104 being fabricated from an insulating material is beneficial in that hood 104 isolates the electrode 170 or needle electrode 170' from the walls of the module body 102. The hood 104 is shaped to surround an upper surface and the side surfaces of the electrode 170. The hood 104 also at least partially encloses a monitor electrode (not shown) overlying the electrode 170 (or needle electrode 170'), and a spacer (not shown) may be disposed between the electrode 170 (or needle electrode 170') and the monitor electrode and between the hood and the monitor electrode, or the monitor electrode is otherwise electrically isolated from the hood 104 and the electrode 170 (or needle electrode 170'). In some embodiments the hood 104 is an electrically conductive material with an electric resistivity of less than about $1\times10^{-3}$ $\Omega\cdot m$, such as less than $1\times10^{-4}$ $\Omega\cdot m$, such as less than $1\times10^{-5}$ $\Omega\cdot m$. In some embodiments, a metal, a metal alloy, or a silicon carbide material hood 104 is utilized. The hood 104 is suspended from the inner surface of the upper wall of the module body 102, and where the hood 104 is conductive, an electrically insulative hood spacer (not shown) is connected to the hood, and the hood spacer 177 is connected to the upper inner surface of the module body 102, to electrically isolate the hood 104 from the module body 102.

Figure 11:
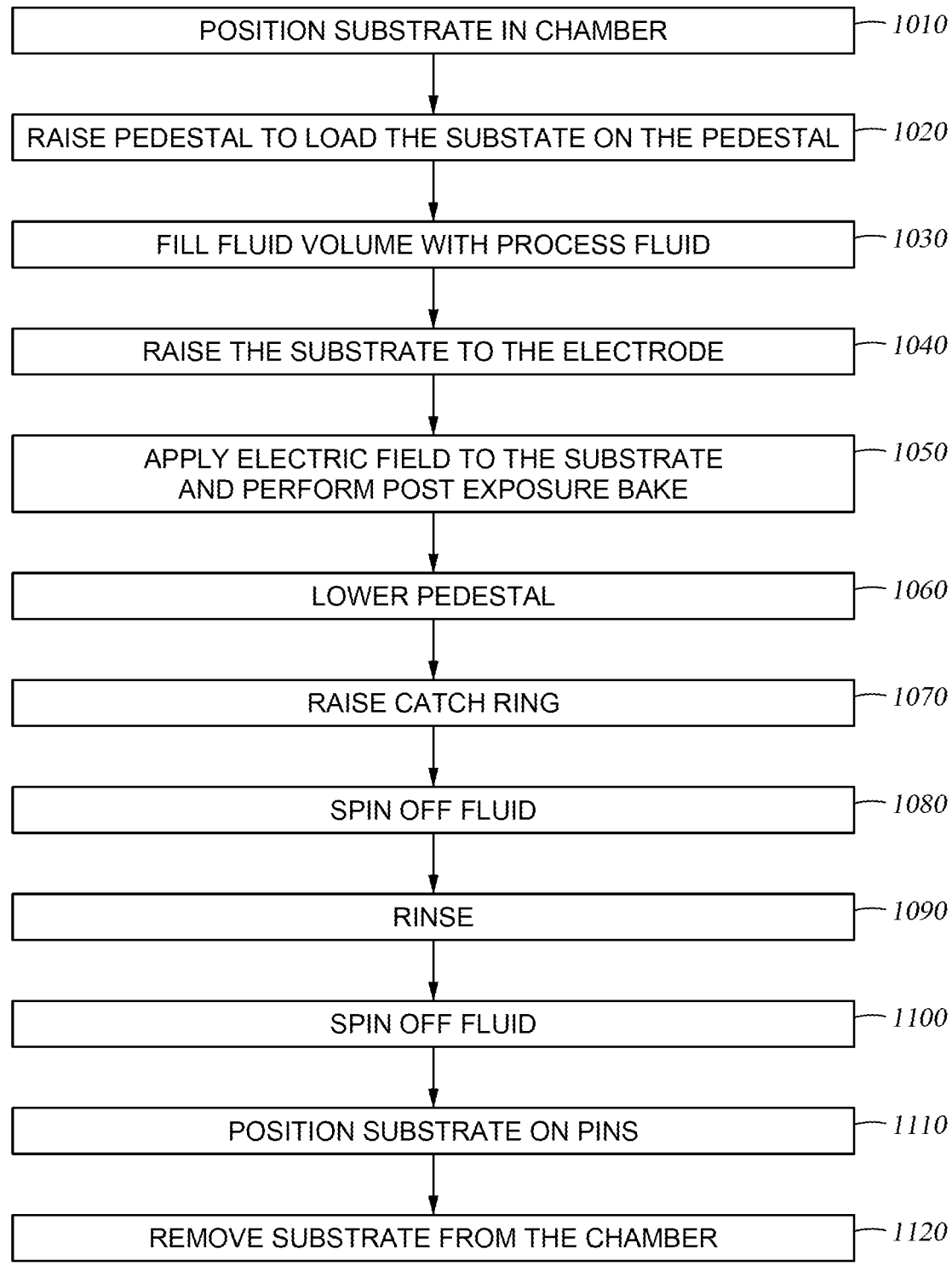
FIG. 11 is a flow chart of a series of activities for treating a substrate in the chamber of FIGS. 1 to 3.

FIG. 11 is a flow chart illustrating one embodiment of a process for a post exposure bake. In a first action 1010, a substrate 150 having a lithographically exposed resist layer thereon enters the chamber through the chamber port 193 and is positioned onto support pins 252 by a robot blade 250. The robot blade 250 is configured to enter the module body 102 through the port 193, lower the substrate 150 onto the heads of the support pins 252, and then retract outwardly of the module body through the port 193. The support pins 252, catch ring 185 and support pedestal 106 are positioned as shown in FIG. 1A during this procedure. Once the substrate 150 is loaded onto the pins, the pedestal 106 is lifted by the pedestal motor 209 to meet the substrate 150 in a second action 1020. A vacuum is applied through the pedestal 106 to releasably secure the substrate 150 to the substrate support surface 174 of the pedestal 106, and the substrate 150 is heated by the heating elements 148. The dispense arm 190 is then swung by the dispense arm motor 145 to the dispensing position above the substrate 150. The pedestal 106 is rotated about its center by the pedestal rotation motor 207 and as the pedestal 106 rotates, process fluid in the form of a conductive fluid is dispensed onto the substrate by the dispense arm in a third action 1030. The fluid stops being dispensed after the fluid has reach a sufficient level on the substrate for process, based on the volume of fluid dispensed. Once the desired volume of the fluid is dispensed, the dispense arm 190 support is rotated to move the dispense nozzle 191a to the side of the chamber so that it is no longer over the pedestal 106 and will not interfere with vertical movement of the pedestal 106 or the catch ring 185 toward the electrode 170. At action four 1040 the pedestal motor 209 rotates the second threaded shaft 205 to lift the pedestal 106 upwardly in the module volume 90 to cause the substrate facing surface of the electrode assembly, for example the substrate facing mesa surfaces 306 of electrode 170' or the annular faces 163 of electrode 170 to extend just inwardly of the fluid. During the process, Nitrogen is pumped at a low pressure into the module volume 90 through the gas port 127 in the module volume for the nitrogen line. Once the fluid is in proper contact with the electrode 170, at a fifth action 1050, the electrode applies a current the process liquid or is charged to a voltage potential, while the pedestal is rotated at up to about 60 rpm to perform the field guided post exposure bake process. If gas evolves during the post exposure bake process, this gas is swept off the surface of the electrode 170 submerged in the fluid by the shear of the fluid which is also rotating as a result of the rotation of the support pedestal 106. Thus, the gas, which is buoyant in the fluid, collects into the recesses of the electrode, for example the recesses formed between the fins 181 or mesas 300 thereof, and move into the plenum between the body of the hood 104 and the electrode 170 or 170'. From there, the gas can be removed to the factory exhaust and to a scrubber.

Figure 12:
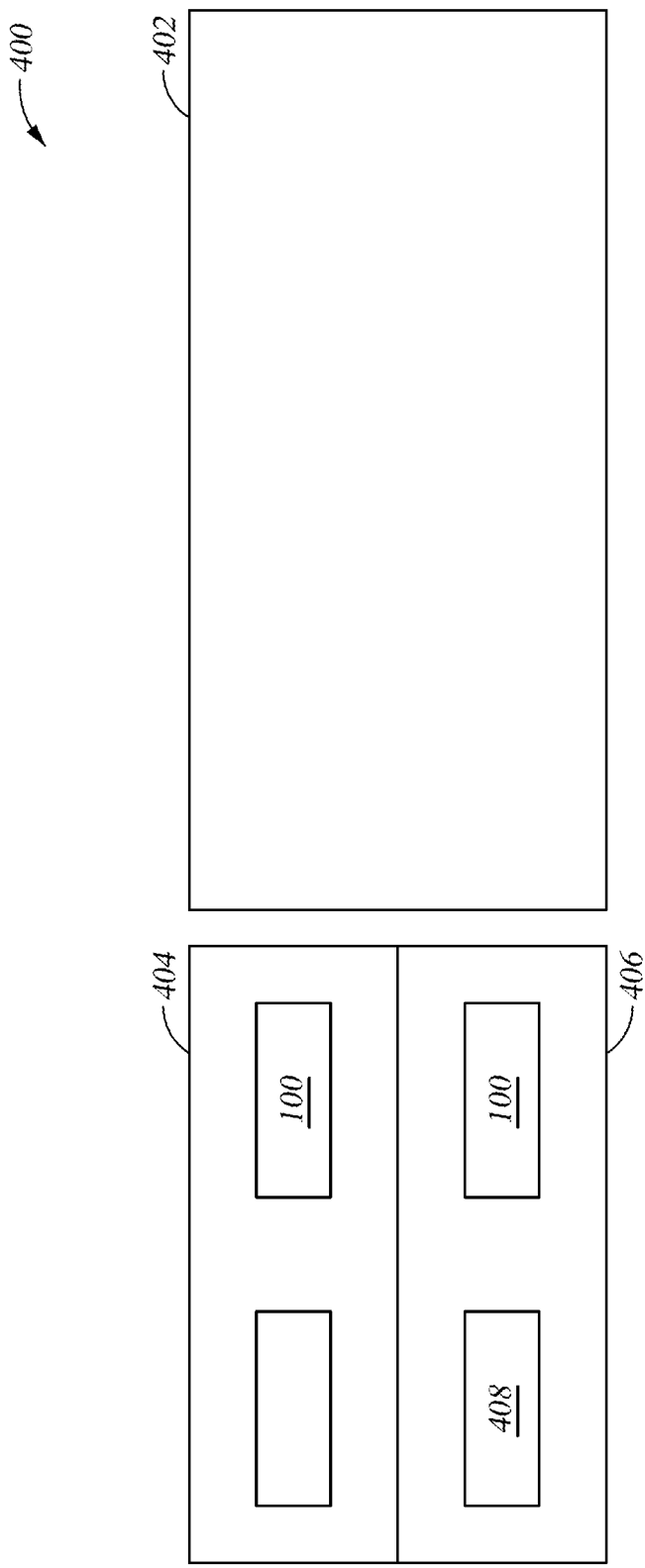
FIG. 12 is a schematic layout of a photolithography tool.
Figure 13:
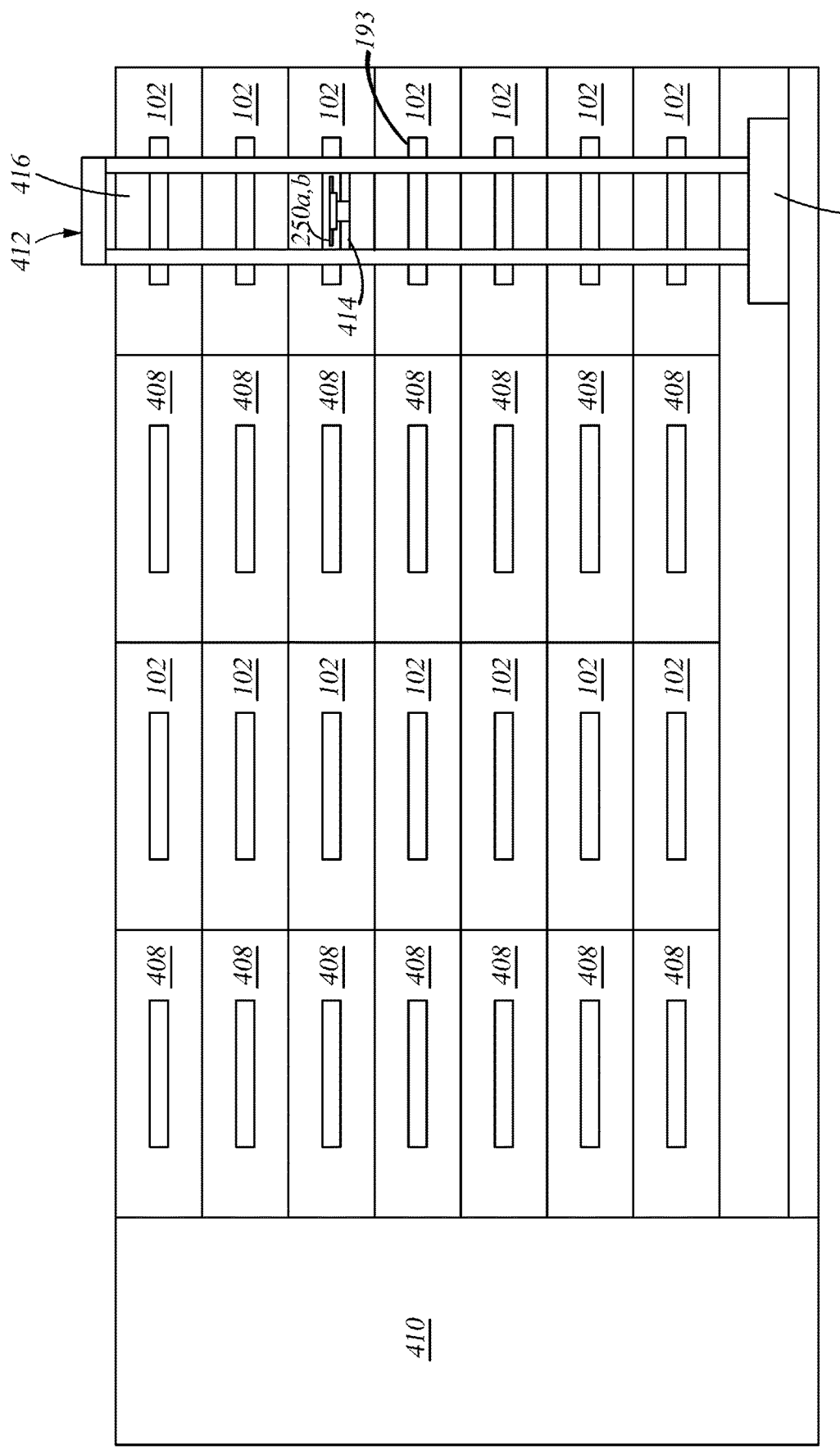
FIG. 13 is a schematic side view of the post exposure process side of the tool of FIG. 12.

After processing, at a sixth action 1060, the support pedestal 106 is lowered by the pedestal motor 209 to a location just above the location when the bases of the support pins will contact the base of the module body 102a. At a seventh action 1070 the catch ring is moved up so that the upper surface 216 of the edge ring 202 is just above the top of the inner wall 230 of the ring 185, and below the upper end wall of the outer wall 232 as shown in FIG. 2. The support pedestal 106 is then rotated by the pedestal rotation motor 207 at an eighth action 1080 to an angular velocity sufficient to accelerate the fluid off of the substrate 150 and into the trough 236 of the catch ring 185, where it may flow into the reservoir 121 through the catch ring drain 186 connected to the trough 236. During this rotation, at a ninth action 1090 the spray arm moves over the substrate 150 and sprays DI water through a second opening 191b thereof to help flush off the fluid from the substrate 150. At this point, at a tenth action 1100, this secondary rinse fluid is accelerated off of the substrate 150 by rotation of the support pedestal 106 by the pedestal rotation motor 207. The pedestal 106 is then lowered by the pedestal motor 242 to engage the substrate 150 with the support pins 252 at an eleventh action 1110 when the support pins 252 contact base of the module body 102 and remain so engaged to support the substrate 150 while the pedestal 106 continues to be lowered by the pedestal motor 242. At this support position, the robot blade 250 enters through the port 193 and is extended under the supported substrate 150 to lift it off the support pins 252. At a twelfth action the robot blade 250 with the substrate 150 retracts toward the chamber wall 189, and removes the substrate 150 through the chamber port 193. At this point these actions can be repeated to process another substrate 150 within the module body. In an additional embodiment, the chambers 100 may be stacked incorporated into a post exposure process module 406 as is shown in FIGS. 12 and 13. In FIG. 12, a modular lithography system 400 if shown schematically, which includes a pre exposure module 404 configured to house the chambers required to deposit a resist layer on a substrate 150 and prepare that resist layer to be exposed to electromagnetic energy, a photolithography module 402 configured to expose the resist layer to electromagnetic energy, and a post exposure module 406 configured to perform post exposure bake of the substrates in a field guided post exposure bake chamber 100, and then develop the resist in a developer chamber 408.

As shown in FIG. 13, the post exposure module includes a plurality of field guided post exposure bake chambers 100, and developing chambers 408 stacked therein. Here, each post exposure bake chamber 100 can share a common fluid reservoir, vacuum source, and nitrogen source and the supply plumbing between these resources and the individual field guided post exposure bake chambers 100. In addition, the chamber exhaust is connected to a common line leading to the factory exhaust. As shown in FIG. 13, for example, two columns or stacks of field guided post exposure bake chambers 100 stacked one over the other, and two columns or stacks of developer chambers 408 stacked one over the other, are provided. The number of stacks, and the number of chambers in each stack, are determined by the number of substrates that need to be simultaneously processed to perform post exposure bake and developing thereof, based on the throughput of the lithographic exposure module 404. An atmospheric robot 412 is provided to retrieve substrates 150 from the lithographic exposure module 404 and pace the substrate into an idle post exposure bake chamber 100, and after post exposure baking is completed, move the substrate 150 to a developing chamber 408. Thereafter, the robot retrieves the substrate from the developer chamber 408, and moves it to a factory interface 410 for placement into a FOUP or other substrate transfer device (not shown).

The robot 412 includes an upright open body 416 supporting an elevation mechanism 418 for vertically moving a blade support plate 414. The open body 416 is horizontally moveable on an elevator 418. Moving the open body on the track positions the robot blades 250a, b on the blade support plate 414 in alignment with one of the stacks of chambers 102, 408. Vertical movement of the blade support plate 414 positions the robot blades 250a, b to access the interior of a post exposure bake chamber 102 through the port 193 thereof. Two robot blades 250a, b are provided, so that one blade contacts the substrate after heating thereof in the post exposure bake chambers 100, whereas the other contracts a substrate before the heating thereof. Motors on the blade support plate 414 move the robot blades 250a, b, also know and end effectors, inwardly and outwardly of the chambers 100, 408, and the elevator 418 also provides the horizontal motion to lift or lower a substrate with respect to the substrate support pins.

What is claimed is:

1. A post lithography resist treatment apparatus for treating a substrate having a resist layer thereon with a liquid fluid layer thereover, comprising:
at least one post exposure bake chamber comprising a substrate support having a substrate support surface thereon, and
an electrode, the electrode comprising an electrode body having a substrate support facing side, the substrate support facing side having at least one recess extending inwardly thereof, and at least one projection adjacent to the recess having a substrate support facing surface thereon, wherein the substrate support is moveable to position a substrate, when supported thereon, such that an fluid layer disposed on the substrate contacts the substrate support facing surface of the projection but does not fill the recess with fluid, and the substrate facing surface of the electrode body is spaced from the substrate.

2. The post lithography resist treatment apparatus of claim 1, wherein the at least one recess is a circumferential recess extending inwardly of the substrate facing side of the electrode body.

3. The post lithography resist treatment apparatus of claim 1, wherein the projection is an annular projection having an annular substrate facing surface thereon.

4. The post lithography resist treatment apparatus of claim 1, wherein the electrode body further includes a second face facing away from the substrate support facing face thereof, and at least one vent channel extends inwardly thereof and intersects the at least one recess within the electrode body.

5. The post lithography resist treatment apparatus of claim 4, further comprising a hood extending over the second face of the electrode body, the hood and the electrode body collectively forming a plenum therebetween.

6. The post lithography resist treatment apparatus of claim 1, wherein the projection is a post extending from and surrounded by the recess in the electrode body.

7. The post lithography resist treatment apparatus of claim 1, further comprising a heater disposed in the substrate support pedestal.

8. A post lithography resist treatment apparatus, comprising:
   at least two post exposure bake chambers stacked one over the other, each post exposure bake chamber comprising:
   a substrate support having a substrate support surface thereon, and an electrode, the electrode having an electrode body comprising a substrate support facing side, the substrate support facing side having at least one recess extending inwardly thereof and at least one projection, adjacent the recess, having a substrate support facing surface thereon,
   wherein the substrate support is moveable to position a substrate, when supported thereon, such that a fluid layer disposed on the substrate contacts the substrate support facing surface of the projection but does not fill the recess with fluid, and the substrate facing surface of the electrode is spaced from the substrate.

9. The post lithography resist treatment apparatus of claim 8, wherein the at least one recess is a circumferential recess extending inwardly of the substrate facing side of the electrode body.

10. The post lithography resist treatment apparatus of claim 8, wherein the projection is an annular projection having an annular substrate facing surface thereon.

11. The post lithography resist treatment apparatus of claim 8, wherein the electrode body further includes a second face facing away from the substrate support facing face, and at least one vent channel extends inwardly thereof and intersects the at least one recess within the electrode.

12. The post lithography resist treatment apparatus of claim 11, further comprising a hood extending over the second face of the electrode body, the hood and the electrode body collectively forming a plenum therebetween.

13. The post lithography resist treatment apparatus of claim 8, wherein the projection is a post extending from, and surrounded by, the recess of the electrode.

* * * * *